(12) United States Patent
Yamada et al.

(10) Patent No.: US 9,287,848 B2
(45) Date of Patent: Mar. 15, 2016

(54) RESONATOR ELEMENT, RESONATOR, OSCILLATOR, ELECTRONIC APPARATUS, AND MOVING OBJECT HAVING REDUCED VIBRATION LEAKAGE

(71) Applicant: SEIKO EPSON CORPORATION, Tokyo (JP)

(72) Inventors: Akinori Yamada, Ina (JP); Osamu Iwamoto, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 125 days.

(21) Appl. No.: 14/062,176

(22) Filed: Oct. 24, 2013

(65) Prior Publication Data

US 2014/0118079 A1    May 1, 2014

(30) Foreign Application Priority Data

Oct. 25, 2012    (JP) ................................. 2012-235417

(51) Int. Cl.
| | |
|---|---|
| H03H 9/21 | (2006.01) |
| H03H 9/215 | (2006.01) |
| H03H 9/205 | (2006.01) |
| H03B 5/32 | (2006.01) |

(52) U.S. Cl.
CPC ................. *H03H 9/215* (2013.01); *H03B 5/32* (2013.01); *H03H 9/205* (2013.01)

(58) Field of Classification Search
CPC .................................. H03H 9/21; H03H 9/215
USPC ....................................................... 310/370
See application file for complete search history.

(56) References Cited

U.S. PATENT DOCUMENTS

| | | | |
|---|---|---|---|
| 6,564,639 B1 * | 5/2003 | Hatanaka et al. | 73/504.16 |
| 6,587,009 B2 | 7/2003 | Kitamura et al. | |
| 7,193,354 B2 | 3/2007 | Kawashima | |
| 7,518,291 B2 | 4/2009 | Tanaya | |
| 8,053,957 B2 | 11/2011 | Sugiyama | |
| 8,400,048 B2 | 3/2013 | Shirai et al. | |
| 2002/0166379 A1 * | 11/2002 | Paros et al. | 73/504.12 |
| 2004/0026362 A1 * | 2/2004 | Nakatani | 216/13 |
| 2005/0116587 A1 * | 6/2005 | Ono et al. | 310/370 |
| 2007/0188055 A1 | 8/2007 | Kuwahara | |
| 2010/0164332 A1 * | 7/2010 | Kawanishi | 310/370 |
| 2011/0001394 A1 * | 1/2011 | Dalla Piazza et al. | 310/325 |
| 2012/0291551 A1 * | 11/2012 | Moore | 73/504.16 |
| 2014/0292431 A1 * | 10/2014 | Yamada | 331/156 |

(Continued)

FOREIGN PATENT DOCUMENTS

| | | |
|---|---|---|
| JP | U-50-81167 | 7/1975 |
| JP | A-52-129395 | 10/1977 |

(Continued)

*Primary Examiner* — J. San Martin
(74) *Attorney, Agent, or Firm* — Oliff PLC

(57) ABSTRACT

A resonator element includes a base portion which includes one end portion and the other end portion opposing the one end portion in a plan view, and a pair of vibrating arms which extend along a first direction from the one end portion of the base portion. The base portion includes a reduced width portion in which a width is gradually decreased along a second direction intersecting the first direction toward a direction side which is separated from the base portion along the first direction, in at least one of the one end portion and the other end portion, and a fixing portion is provided between the one end portion and the other end portion of the base portion.

20 Claims, 28 Drawing Sheets

(56) References Cited

U.S. PATENT DOCUMENTS

| | | | |
|---|---|---|---|
| 2014/0292432 A1* | 10/2014 | Yamada | 331/156 |
| 2014/0292435 A1* | 10/2014 | Yamada | 331/158 |

FOREIGN PATENT DOCUMENTS

| JP | A-53-59472 | 5/1978 |
|---|---|---|
| JP | A-53-136990 | 11/1978 |
| JP | A-54-3487 | 1/1979 |
| JP | A-54-7285 | 1/1979 |
| JP | A-55-37086 | 3/1980 |
| JP | U-55-171114 | 12/1980 |
| JP | H02-20110 A | 1/1990 |
| JP | A-2002-261575 | 9/2002 |
| JP | A-2005-236563 | 9/2005 |
| JP | A-2007-201936 | 8/2007 |
| JP | A-2007-258918 | 10/2007 |
| JP | A-2008-79014 | 4/2008 |
| JP | A-2009-206590 | 9/2009 |
| JP | A-2011-151567 | 8/2011 |
| JP | A-2011-151568 | 8/2011 |
| JP | A-2012-119920 | 6/2012 |
| WO | 2010/035714 A1 | 4/2010 |

* cited by examiner

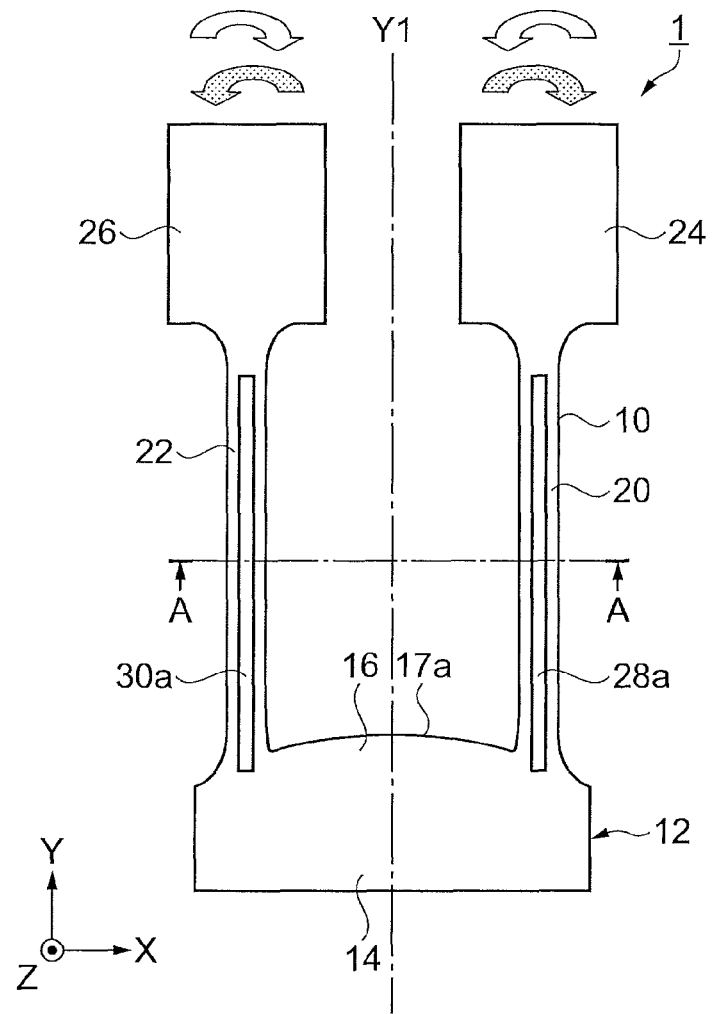
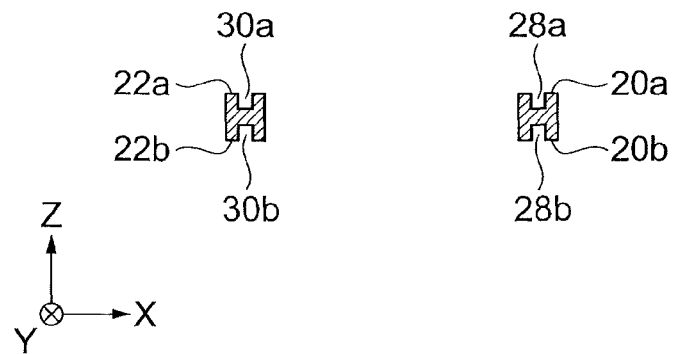

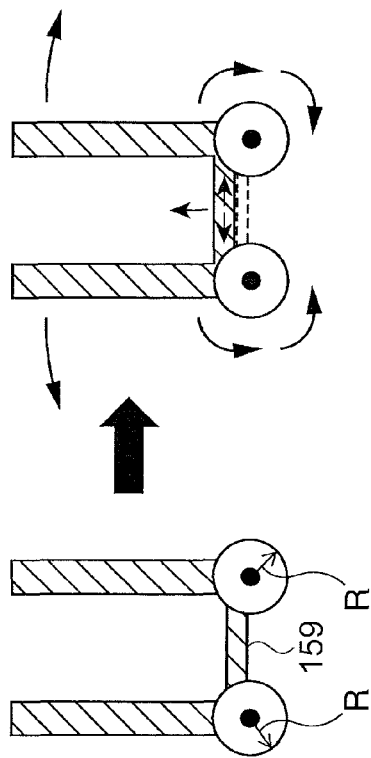
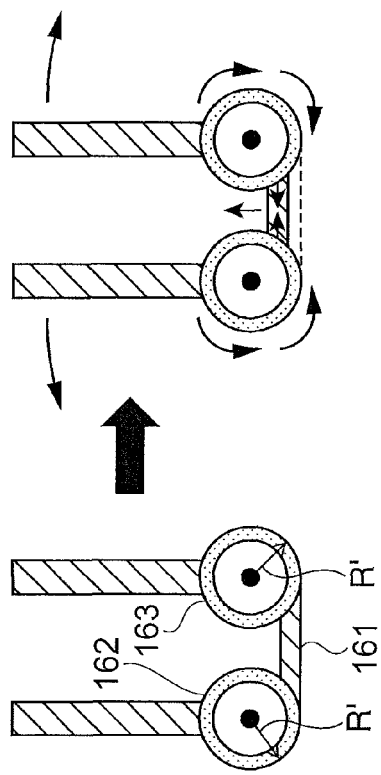

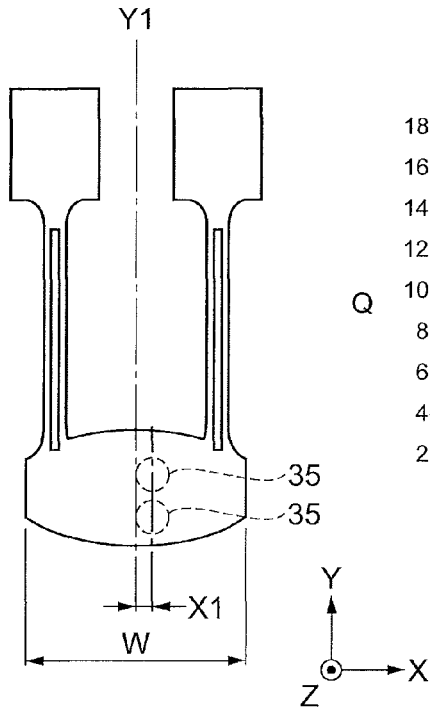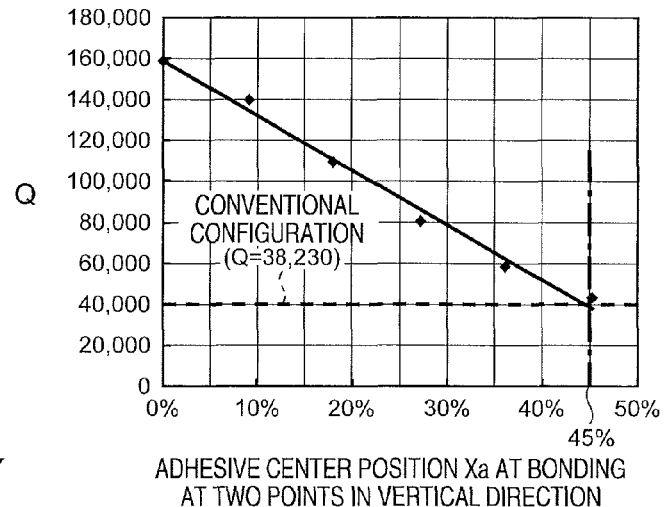
FIG. 17A　　　　　　　　FIG. 17B
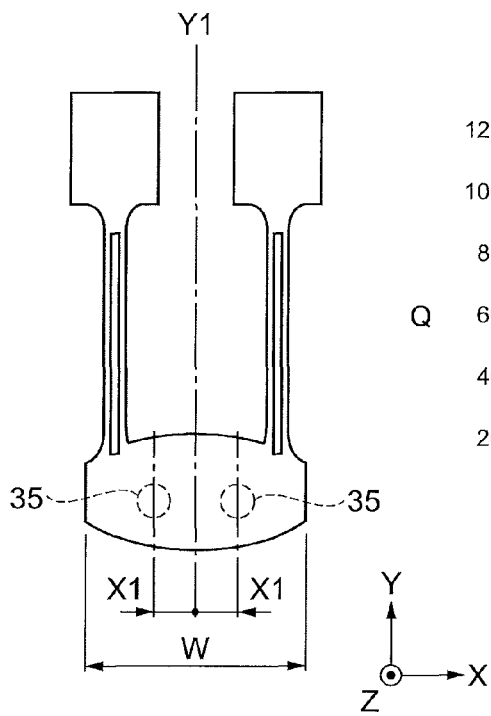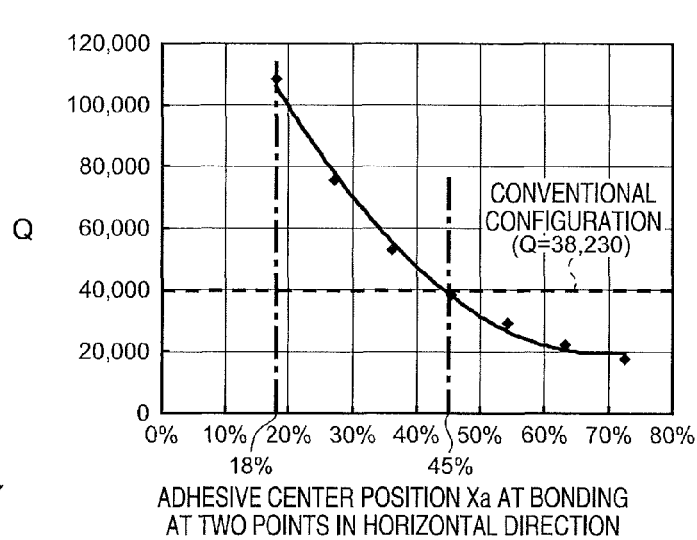
FIG. 18A　　　　　　　　FIG. 18B

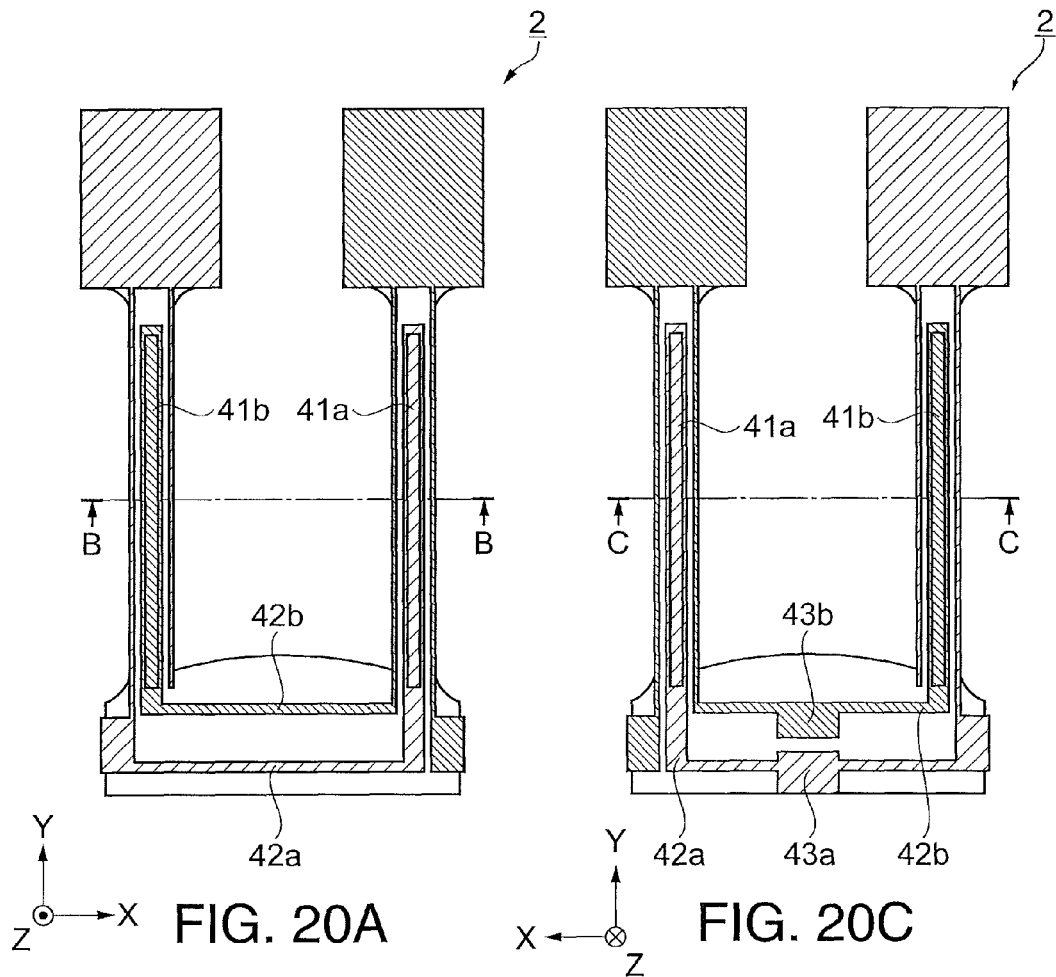
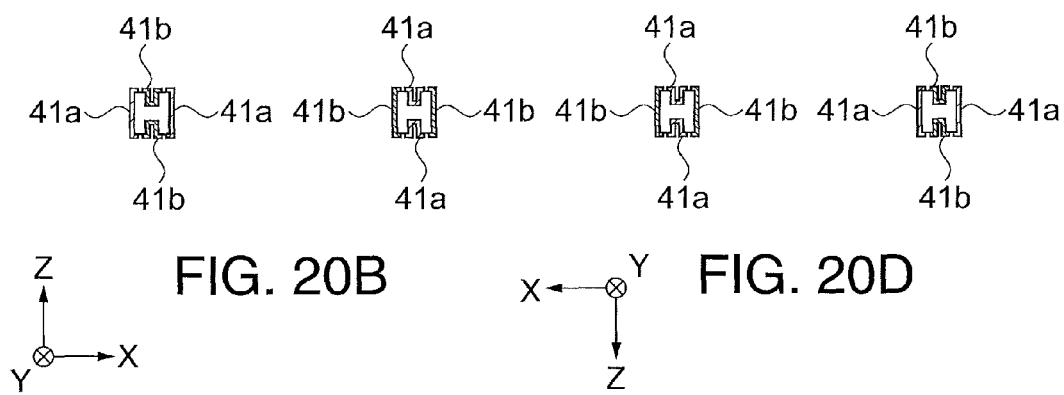
FIG. 20A  FIG. 20B  FIG. 20C  FIG. 20D

RESONATOR ELEMENT, RESONATOR, OSCILLATOR, ELECTRONIC APPARATUS, AND MOVING OBJECT HAVING REDUCED VIBRATION LEAKAGE

BACKGROUND

1. Technical Field

The present invention relates to a resonator element, a resonator, an oscillator, an electronic apparatus, and a moving object.

2. Related Art

In a compact information apparatus such as a Hard Disk Drive (HDD), a mobile computer, or an IC card, and in a mobile communication apparatus such as a cellular phone, a car phone, or a paging system, or the like, an electronic device such as a resonator or an oscillator is widely used.

In the related art, an example of a resonator element used in the electronic device is shown in FIG. 31.

In FIG. 31, in a resonator element 101, the shown outline is formed by etching a piezoelectric material such as quartz crystal, and the resonator element includes a rectangular base portion 112 which is mounted on a package (not shown) or the like, and a pair of vibrating arms 120 and 122 which extend upward in the drawing from a main body portion 114 which supports and connects the vibrating arms of the base portion 112. In addition, grooves 128 and 130 and a necessary driving electrode (not shown) are formed on a principle surface (front and rear surfaces) of the vibrating arms.

In the resonator element 101, if a driving voltage is applied via the driving electrode, approaching and separation between tip portions of each of the vibrating arms 120 and 122 are repeated, the tip portions are flexurally vibrated, and thus, a signal of predetermined frequency is extracted.

However, the vibration of the resonator element 101 is propagated to the base portion 112 side according to the flexural vibration of the vibrating arms 120 and 122, and the vibration may be leaked from the base portion 112 to a member (adhesive, metal bump, or the like) which fixes the resonator element. Accordingly, in the resonator element 101, a decrease in a Q value occurs, and as a result, there is a problem that a Crystal Impedance (CI) value is increased.

In order to prevent the problems, in JP-A-2002-261575, a resonator element is disclosed, which has a structure in which notches are formed in a base portion at a position closer to a vibrating arm side than a location fixed to a package or the like.

Moreover, also in JP-A-2005-236563, a resonator element is disclosed, which has a structure in which a through groove is formed at a position closer to a vibrating arm side than a location fixed to a package or the like.

According to effects of the notch or the through groove, the leakage of the vibration from the vibrating arm is decreased, and the leakage of the vibration from the base portion to the member which fixes the resonator element is suppressed.

However, while reduction in the sizes of various apparatuses on which the resonator elements are mounted is progressed, it is necessary to decrease the size of the resonator element itself as much as possible.

Accordingly, in the resonator element disclosed in JP-A-2002-261575 or JP-A-2005-236563, since the notch or the through groove is provided in the base portion and a length of a transmission path of the vibration leakage from the vibrating arm side to the fixed location is lengthened, a length of the resonator element is lengthened, and there is a problem that reduction in the size of the resonator element is difficult to obtain.

SUMMARY

An advantage of some aspects of the invention is to solve at least a part of the problems described above, and the invention can be implemented as the following forms or application examples.

Application Example 1

This application example is directed to a resonator element including: a base portion which includes one end portion and the other end portion opposing the one end portion in a plan view; and a pair of vibrating arms which extend along a first direction from the one end portion of the base portion. The base portion includes a reduced width portion in which a width of the base portion in a second direction intersecting the first direction is gradually decreased along the first direction, in at least one of the one end portion and the other end portion, and a fixing portion for fixing the resonator element is provided between the one end portion and the other end portion of the base portion.

According to this application example, even though the base portion of the resonator element has a short length in the direction in which the vibrating arms extend, since the reduced width portion is provided in the base portion which connects a first vibrating arm and a second vibrating arm, stiffness of the one end portion or the other end portion of the base portion is increased, deformation of the one end portion or the other end portion according to flexural vibration of two vibrating arms is suppressed, vibration leakage from the fixing portion of the base portion to a fixing member can be suppressed, and thus a small-sized resonator element can be obtained. Moreover, a decrease in a Q value due to the vibration leakage can be suppressed.

Application Example 2

This application example is directed to the resonator element according to the application example described above, wherein an outer edge of the reduced width portion passes through the center between the pair of vibrating arms in a plan view, and has a symmetrical shape with respect to a virtual center line along the first direction.

According to this application example, the outer edge of the reduced width portion provided in the base portion is formed so as to be symmetric laterally with respect to the virtual center line, and thus, stress to the base portion according to the deformation, which is generated by flexural vibration of two vibrating arms and is laterally symmetric with respect to the virtual center line, is received equally from the left and right and can be offset. Accordingly, the deformation of the fixing portion of the base portion is suppressed, the vibration leakage can be suppressed, and thus a small-sized resonator element can be obtained.

Application Example 3

This application example is directed to the resonator element according to the application example described above, wherein the outer edge of the reduced width portion has a curved shape.

According to this application example, since the shape of the outer edge of the reduced width portion has a curved shape, the stiffness of the one end portion or the other end portion of the base portion can be further increased. Accordingly, deformation of a center portion of the base portion is suppressed, the vibration leakage can be further suppressed, and thus a small-sized resonator element can be obtained.

Application Example 4

This application example is directed to the resonator element according to the application example described above, wherein the outer edge of the reduced width portion includes a pair of inclined portions which are inclined in mutually reversed directions with respect to the second direction.

According to this application example, end portions of the tip side in the protrusion direction of the pair of inclined portions are spatially connected to each other and are protruded from the base portion, and thus, the stiffness of the one end portion or the other end portion, in which the reduced width portion of the base portion is positioned, can be further increased. Accordingly, the deformation of the center portion of the base portion is suppressed, the vibration leakage can be further suppressed, and thus a small-sized resonator element can be obtained.

Application Example 5

This application example is directed to the resonator element according to the application example described above, wherein the reduced width portion includes a corner in a connection portion of the pair of inclined portions.

According to this application example, the corner in which the pair of inclined portions are sides is provided, and accordingly, the stiffness of the one end portion or the other end portion, in which the reduced width portion of the base portion is positioned, can be further increased, the deformation of the fixing portion of the base portion is suppressed, the vibration leakage can be further suppressed, and thus a small-sized resonator element can be obtained.

Application Example 6

This application example is directed to the resonator element according to the application example described above, wherein the reduced width portion is provided in the one end portion side.

According to this application example, the reduced width portion is provided on the upper portion (vibrating arm) side of the base portion in which the first vibrating arm and the second vibrating arm are connected to each other, and thus, the stiffness in the lower portion (the vibrating arm is not connected) direction of the base portion can be increased, and particularly, the deformation in the lower direction of the center portion of the base portion, which is generated when the tip portions of two vibrating arms approach each other, can be reduced. Accordingly, the vibration leakage from the fixing portion of the base portion to a joining member or the like can be prevented, and thus a small-sized resonator element can be obtained.

Application Example 7

This application example is directed to the resonator element according to the application example described above, wherein the reduced width portion is provided in the other end portion side.

According to this application example, the reduced width portion is provided on the lower portion side of the base portion in which the first vibrating arm and the second vibrating arm are connected to each other, and thus, the stiffness in the upper direction can be increased, and particularly, the deformation in the upper direction of the center portion of the base portion, which is generated when the tip portions of two vibrating arms are separated from each other, can be reduced. Accordingly, a resonator element is obtained, in which the vibration leakage from the fixing portion of the base portion to a joining member or the like can be prevented.

Application Example 8

This application example is directed to the resonator element according to the application example described above, wherein the reduced width portion is provided in both of the one end portion side and the other end portion side.

According to this application example, the reduced width portion is provided on the upper portion (vibrating arm is present) side and the lower portion (vibrating arm is not present) side of the base portion in which the first vibrating arm and the second vibrating arm are connected to each other, and thus, the stiffness in both of the upper direction and the lower direction can be further increased, the deformation in both of the upper direction and the lower direction of the center portion of the base portion, which is generated when the tip portions of two vibrating arms approach each other and are separated from each other, can be reduced. Accordingly, the vibration leakage from the fixing portion of the base portion to the joining member or the like can be significantly decreased, and a resonator element in which a decrease of the Q value is suppressed can be obtained.

Application Example 9

This application example is directed to the resonator element according to the application example described above, wherein the fixing portion passes through the center between the pair of vibrating arms in a plan view, and is positioned in two locations different from each other on the virtual center line along the first direction, and when a length in the second direction of the base portion is defined as W and a length from the virtual center line to a center of the fixing portion is defined as X1, $X1/(W/2) \times 100$ is 0% or more and 45% or less.

According to this application example, when the resonator element having the reduced width portion in the one end portion or the other end portion of the base portion is mounted on a container, the position of the fixing portion is set so that $X1/(W/2) \times 100$ is within the range of 0% or more and 45% or less, and thus, the vibration leakage from the fixing portion of the base portion to the joining member or the like can be further reduced, and a resonator element in which a decrease of the Q value is suppressed can be obtained.

Application Example 10

This application example is directed to the resonator element according to the application example described above, wherein the fixing portion is positioned in two locations different from each other along the second direction, and when a length in the second direction of the base portion is defined as W, and a length which passes through the center between the pair of vibrating arms and is from the virtual center line along the first direction to the center of the fixing portion is defined as X1, $X1/(W/2) \times 100$ is 18% or more and 45% or less.

According to this application example, when the resonator element having the reduced width portion in the one end portion or the other end portion of the base portion is mounted on a container, the position of the fixing portion is set so that $X1/(W/2) \times 100$ is within the range of 18% or more and 45% or less, and thus, the vibration leakage from the fixing portion of the base portion to the joining member or the like can be further reduced, and a resonator element in which a decrease of the Q value is suppressed can be obtained.

Application Example 11

This application example is directed to a resonator including: the resonator element according to the application example described above; and a container to which the fixing portion of the resonator element is fixed.

According to this application example, since the resonator element is mounted on the container, influence of disturbances such as a temperature change or humidity change or influence due to contamination can be decreased. Accordingly, a resonator having improved frequency reproducibility and frequency aging characteristics can be obtained.

Application Example 12

This application example is directed to the resonator according to the application example described above, wherein one location of the fixing portion is fixed.

According to this application example, since one location of the fixing portion of the resonator element is fixed, mounting distortion due to the difference of a linear expansion coefficient between the fixing portion and the container can be decreased. Accordingly, a resonator is obtained in which deterioration of frequency temperature characteristics, frequency reproducibility, and frequency aging characteristics due to the mounting distortion is suppressed.

Application Example 13

This application example is directed to the resonator according to the application example described above, wherein an electrode pad provided in the other principle surface opposite to one principle surface of the fixing portion side of the base portion, and an electrode terminal provided in the container are connected to each other by a wire.

According to this application example, since the electrode pad of the resonator element and the electrode terminal of the container are connected to each other by a wire, the fixing of the resonator element can be performed at one location. Accordingly, mounting distortion due to the difference of a linear expansion coefficient between the fixing portion and the container can be decreased, and a resonator is obtained in which deterioration of frequency temperature characteristics, frequency reproducibility, and frequency aging characteristics due to the mounting distortion is suppressed.

Application Example 14

This application example is directed to an oscillator including: the resonator element according to the application example described above; and a circuit.

According to this application example, a decrease of the Q value due to the vibration leakage is suppressed, and the oscillator can be configured of the resonator element in which reduction in the size is possible, the oscillation circuit exciting the resonator element, or the like. Accordingly, a small-sized oscillator having stable oscillation characteristics can be obtained.

Application Example 15

This application example is directed to an electronic apparatus including the resonator element according to the application example described above.

According to this application example, since a decrease of the Q value due to the vibration leakage is suppressed and a small-sized resonator element is used, an electronic apparatus including a small-sized oscillator having stable oscillation characteristics can be configured.

Application Example 16

This application example is directed to a moving object including the resonator element according to the application example described above.

According to this application example, since a decrease of the Q value due to the vibration leakage is suppressed and a small-sized resonator element is used, a moving object can be configured in which an electronic control unit, which includes a small-sized oscillator having stable oscillation characteristics and is stable with high accuracy, is mounted.

BRIEF DESCRIPTION OF THE DRAWINGS

The invention will be described with reference to the accompanying drawings, wherein like numbers reference like elements.

FIGS. 1A and 1B are schematic views showing a structure of a resonator element according to a first embodiment of the invention, of which, FIG. 1A is a plan view, and FIG. 1B is a cross-sectional view taken along A-A line.

FIGS. 4A and 4B are plan views illustrating a principle of vibration leak suppression, of which, FIG. 4A is a schematic plan view of the resonator element of the related art, and FIG. 4B is a plan view of a simplified model.

FIGS. 5A to 5D are views illustrating the principle of the vibration leak suppression, of which, FIG. 5A is an exploded view in which a connection portion is positioned in an upper portion, FIG. 5B is an exploded view in which the connection portion is positioned in a center, FIG. 5C is an exploded view in which the connection portion is positioned in a lower portion, and FIG. 5D is an exploded view in which the connection portion is positioned in a lower portion of a rotating body.

FIGS. 6A and 6B are plan views illustrating the principle of the vibration leak suppression, of which, FIG. 6A is a schematic plan view of the resonator element according to the first embodiment, and FIG. 6B is a plan view of a simplified model.

FIGS. 7A to 7D are views illustrating the principle of the vibration leak suppression, of which, FIG. 7A is an exploded view in which a connection portion is positioned in an upper portion, FIG. 7B is an exploded view in which the connection portion is positioned in a center, FIG. 7C is an exploded view in which the connection portion is positioned in a lower portion, and FIG. 7D is an exploded view in which an arch-shaped connection portion is positioned in an upper portion of a rotating body.

FIGS. 9A and 9B are plan views illustrating the principle of the vibration leak suppression, of which, FIG. 9A is a schematic plan view of the resonator element according to the second embodiment, and FIG. 9B is a plan view of a simplified model.

FIGS. 10A to 10D are views illustrating the principle of the vibration leak suppression, of which, FIG. 10A is an exploded view in which a connection portion is positioned in an upper portion, FIG. 10B is an exploded view in which the connection portion is positioned in a center, FIG. 10C is an exploded view in which the connection portion is positioned in a lower portion, and FIG. 10D is an exploded view in which an arch-shaped connection portion is positioned in a lower portion of a rotating body.

FIGS. 17A and 17B are views showing a relationship between an adhesive center position and a Q value when the resonator element according to the embodiment of the invention is bonded at two points in a vertical direction, of which, FIG. 17A is a plan view showing the position of the adhesive when the resonator element is bonded at two points in a vertical direction, and FIG. 17B is a view showing the relationship between the adhesive center position and the Q value.

FIGS. 18A and 18B are views showing a relationship between the adhesive center position and the Q value when the resonator element according to the embodiment of the invention is bonded at two points in a horizontal direction, of which, FIG. 18A is a plan view showing the position of the adhesive when the resonator element is bonded at two points in a horizontal direction, and FIG. 18B is a view showing the relationship between the adhesive center position and the Q value.

FIGS. 19A and 19B are views showing a relationship between the adhesive center position and the Q value when the resonator element according to the embodiment of the invention is bonded at one point, of which, FIG. 19A is a plan view showing the position of the adhesive when the resonator element is bonded at one point, and FIG. 19B is a view showing the relationship between the adhesive center position and the Q value.

FIGS. 20A and 20B are schematic views showing an example in which an electrode is wired on the resonator element according to the embodiment of the invention, of which, FIG. 20A is an electrode wiring diagram of a front surface, FIG. 20B is a cross-sectional view taken along B-B line, FIG. 20C is an electrode wiring diagram of a rear surface, and FIG. 20D is a cross-sectional view taken along C-C line.

FIGS. 21A and 21B are schematic views showing a structure of a resonator according to the embodiment of the invention, of which, FIG. 21A is a plan view, and FIG. 21B is a cross-sectional view taken along A-A line.

FIGS. 22A and 22B are schematic views showing Modification Example 1 in which the resonator element according to the embodiment of the invention is mounted on a package, of which, FIG. 22A is a plan view, and FIG. 22B is a cross-sectional view taken along A-A ine.

FIGS. 23A and 23B are schematic views showing Modification Example 2 in which the resonator element according to the embodiment of the invention is mounted on a package, of which, FIG. 23A is a plan view, and FIG. 23B is a cross-sectional view taken along A-A line.

FIGS. 24A and 24B are schematic views showing Modification Example 3 in which the resonator element according to the embodiment of the invention is mounted on a package, of which, FIG. 24A is a plan view, and FIG. 24B is a cross-sectional view taken along A-A line.

FIGS. 25A and 25B are schematic views showing Modification Example 4 in which the resonator element according to the embodiment of the invention is mounted on a package, of which, FIG. 25A is a plan view, and FIG. 25B is a cross-sectional view taken along A-A line.

DESCRIPTION OF EXEMPLARY EMBODIMENTS

Hereinafter, embodiments of the invention will be described in detail with reference to drawings.

Resonator Element

First Embodiment

Figure 2:
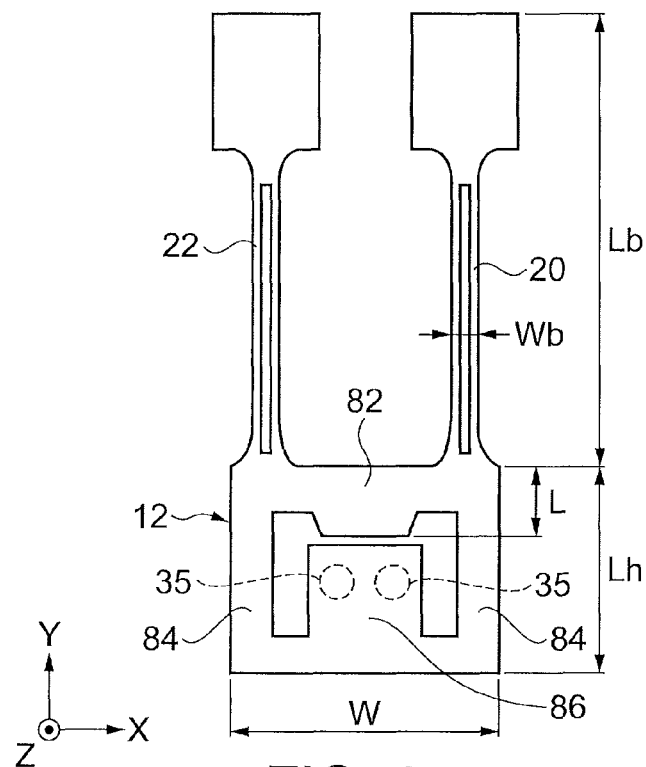
FIG. 2 is a plan view showing a structure of a resonator element (refer to JP-A-2005-236563) according to the related art used in simulation.
Figure 3:
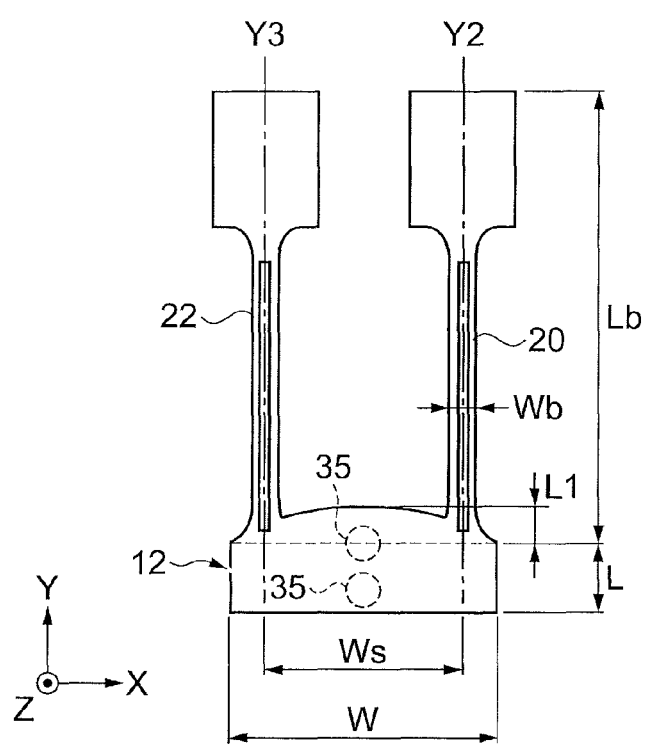
FIG. 3 is a plan view showing a structure of a resonator element according to the first embodiment used in simulation.

FIGS. 1A and 1B are schematic views showing a structure of a resonator element according to a first embodiment of the invention, of which, FIG. 1A is a plan view, and FIG. 1B is a cross-sectional view taken along A-A line in FIG. 1A. FIGS. 2 and 3 are plan views showing a structure of a simulated resonator element, FIG. 2 is a plan view of a resonator element (refer to JP-A-2005-236563) according to the related art, and FIG. 3 is a plan view of the resonator element according to the first embodiment of the invention. Moreover, in each drawing, for convenience of description, an X axis, a Y axis, and a Z axis which are three axes orthogonal to one another are shown. In addition, in the description below, for convenience of description, a planar view when viewed from a Z axis direction is simply referred to as a "plan view".

A resonator element 1 shown in FIGS. 1A and 1B is configured of a vibration substrate 10 which includes a base portion 12, vibrating arms 20 and 22, weight portions 24 and 26, and grooves 28a, 28b, 30a, and 30b.

For example, the vibration substrate 10 is configured of quartz crystal, particularly, a Z cut quartz crystal plate. Accordingly, the resonator element 1 can exhibit excellent vibration characteristics. The Z cut quartz crystal plate refers to a quartz crystal substrate which has a Z axis (optical axis) of quartz crystal as a thickness direction. It is preferable that the Z axis coincide with the thickness direction of the vibration substrate 10. However, from the viewpoint of decreasing a frequency temperature change near normal temperature, the Z axis may be slightly (for example, approximately less than 15°) inclined in the thickness direction.

Here, an outline of the vibration substrate 10 is processed by wet-etching a quartz crystal substrate, crystal planes of the quartz crystal appear on a contour of the vibration substrate 10, and thus, shape symmetry of the resonator element 1 is deteriorated. In order to form a shape which decreases the appearance of the crystal planes, it is preferable that the thickness of the vibration substrate 10 be 70 μm or less. Moreover, in order to decrease a CI value, it is preferable that the thickness of the vibration substrate 10 be thicker than 70 μm and thinner than 300 μm to make a drive region be large. In addition, even though the vibration substrate has a thickness in which the crystal planes easily appear, in order to decrease the appearance, when the outline is etched, it is preferable that an etching amount (etching time) of 2 times to 30 times be set with respect to the etching amount (etching time) when the substrate is penetrated in the thickness direction by wet etching.

That is, setting the etching amount (time) to be 2 to 30 times results in performing over-etching, and occurrence of fins which appear on the outline of the resonator element can be reduced. The point in time of passing through by the etching of the outline shape is defined as the over-etching being not present, and with respect to this, the fin appearing on the outline is decreased by performing the over-etching, and a structure in which the vibration leakage is not easily generated can be obtained.

The vibration substrate 10 includes the base portion 12, and two vibrating arms 20 and 22 which protrude in the +Y axis direction from the base portion 12 and are provided so as to be arranged in the X axis direction. The vibration substrate 10 is formed to be symmetrical with respect to a virtual center line Y1 parallel to the Y axis.

The base portion 12 has an approximately plate shape which spreads in an XY plane and has a thickness in the Z axis direction. The base portion 12 includes a main body portion 14 which supports and connects the vibrating arms 20 and 22, and a reduced width portion 16 which reduces vibration leakage.

In the main body portion 14, the width (length in the X axis direction) is approximately constant along the Y axis direction. That is, the main body portion 14 has an approximately rectangular shape in a plan view. Moreover, the reduced width portion 16 is connected to an outer edge in the +Y axis direction side of the main body portion 14. That is, the reduced width portion 16 is provided in the same side as each of the vibrating arms 20 and 22 via the main body portion 14.

The contour of the reduced width portion 16 is configured of a curve portion 17a having a curved shape and a curvature radius of the curve portion 17a is constant over the entire region. Moreover, virtual extension lines of both ends of the curve portion 17a are connected to each corner in the +Y axis direction side of the main body portion 14.

In addition, when the outline of the vibration substrate 10 is processed by wet-etching a quartz crystal substrate, since the crystal planes of the quartz crystal appear on the contour of the vibration substrate 10, the curve portion 17a can be regarded as an aggregation of short linear portions if it is viewed microscopically. However, also in this case, the contour is included in the "curved shape". Moreover, in this case, a curve may be formed by additionally performing wet-etching so that the crystal planes do not appear on the more inside (main body portion 14 side) than the curve portion 17a which becomes an aggregation of the short linear portions.

The vibrating arms 20 and 22 are provided so as to be arranged in the X axis direction, and each of the vibrating arms extends in the +Y axis direction from the base portion 12. Moreover, each of the vibrating arms 20 and 22 includes weight portions 24 and 26, in which widths in the X axis direction are wider than those of the base portion 12 side of the vibrating arms 20 and 22, in tip portions of vibrating arms. By providing the weight portions 24 and 26, reduction in the size of the resonator element 1 can be improved, or frequency of flexural vibration of the vibrating arms 20 and 22 can be lowered. Moreover, the weight portion 24 and 26 may include a plurality of widths in the X axis direction if necessary, and may be omitted.

Furthermore, in the vibrating arm 20, a groove 28a, which is opened to one principle surface 20a and has a bottom, and a groove 28b, which is opened to the other principle surface 20b and has a bottom, are formed. Similarly, in the vibrating arm 22, a groove 30a, which is opened to one principle surface 22a and has a bottom, and a groove 30b, which is opened to the other principle surface 22b and has a bottom, are formed. The grooves 28a, 28b, 30a, and 30b are provided to extend in the Y axis direction and have the same shape as one another. Accordingly, as shown in FIG. 1B, the vibrating arms 20 and 22 have cross-sectional shapes having concave portions on the front side and the rear side. By forming the grooves 28a, 28b, 30a, and 30b, heat generated by the flexural vibration is not easily diffused (heat-conducted), and in an insulation region which is a region (f>f0) in which flexural vibration frequency (mechanical flexural vibration frequency) f is larger than thermal relaxation frequency f0, thermoelastic loss can be reduced. Moreover, the grooves 28a, 28b, 30a, and 30b may be provided or may be omitted if necessary.

A depth of the groove is equal to or more than 30% and less than 50% with respect to the thickness of the resonator element 1, and if the groove is formed on the front and rear of the vibrating arm, the thermoelastic loss is decreased, and the CI value can be decreased by increasing an area which is interposed by the excitation electrodes.

Moreover, a half of a value, which subtracts the width of the groove from the width of the vibrating arm, is defined as a side wall width, and if the side wall width is set to 20 μm or less, an electric field which is generated at the area interposed between the excitation electrodes is increased, and the CI value can be decreased. Furthermore, more preferably, the side wall width is within a range of 5 μm or more and 9 μm or less in which thermoelastic loss is most decreased.

A mode, in which two vibrating arms vibrate in the same direction with respect to the Z direction, is a Z common mode. A mode, in which two vibrating arms vibrate in a direction separating from each other with respect to the Z direction, is a Z reverse mode. A mode, in which two vibrating arms vibrate in the same direction with respect to the X direction, is an X common mode. A mode, in which two vibrating arms vibrate in a direction separating from each other or approaching each other with respect to the X direction, is an X reverse mode. A common mode, in which each of two vibrating arms is deformed to rotate with an Y2 axis and an Y3 axis parallel to the Y axis as the axis, is a torsional common mode. Moreover, a mode reverse to the torsional common mode is a torsional reverse mode. Accordingly, a mode excited in the invention is the X reverse mode, and the shape of the X reverse mode is designed so that the resonance frequencies of the Z common mode and the higher mode, the Z reverse mode and the higher mode, the X common mode and the higher mode, the torsional common mode and the higher mode, and the torsional reverse mode and the higher mode are different from one another. Therefore, there is no concern that the X reverse mode is strongly combined with other modes, and a stable resonator element is obtained in which deterioration of frequency temperature characteristics due to the combination or an increase of the vibration leakage is not generated and the characteristic variation is small.

As described above, the configuration of the resonator element 1 is simply described. Next, improvement of the vibration characteristics by providing the above-described reduced width portion 16 is demonstrated based on simulation results. Moreover, hereinafter, in a basic mode of the flexural vibration in which the vibrating arms 20 and 22 approach each other or are separated from each other, simulation, which uses a resonator element having the flexural vibration frequency (mechanical flexural vibration frequency) f of approximately 32.768 kHz, is used representatively. However, when the flexural vibration, in which the vibrating arms 20 and 22 approach each other or are separated from each other, is used, the inventors confirm that there are tendencies similar to the simulation results below, even though the flexural vibration frequency f is changed as it can be easily imagined from a mechanism described below.

FIG. 2 is a plan view showing a structure of the resonator element (refer to JP-A-2005-236563) according to the related art used in simulation, and FIG. 3 is a plan view showing a structure of the resonator element according to the first embodiment used in simulation.

In the size of each of the vibrating arms 20 and 22 of the resonator element used in this simulation, a length Lb (a length including the weight portions 24 and 26) is set to 1038 μm, a thickness is set to 114 μm, a width Wb is set to 71 μm, and a width W of the base portion 12 is set to 520 μm. Moreover, the inventors confirm that there are tendencies similar to the simulation results below even though the sizes of the vibrating arms 20 and 22 or the size of the base portion 12 are changed.

Here, in the simulation, an extent of a Q value which deteriorated due to only the vibration leakage was analyzed and evaluated.

FIG. 2 shows the resonator element (refer to JP-A-2005-236563) according to the related art in which a length (a length in the Y axis direction) L of a portion which supports and connects the vibrating arms 20 and 22 of the base portion 12 to the base portion 12 is 122 μm, and a length Lh of the entire base portion 12 is 345 μm, and the Q value is 38,230. Moreover, FIG. 3 shows the resonator element according to the first embodiment of the invention in which the reduced width portion 16 is formed in the base portion 12, a length L from the connection portions of the vibrating arms 20 and 22 of the base portion 12 to the end portion opposite to the connection portions of the base portion 12 is 122 μm, and a length L1 of the reduced width portion 16 is 42 μm, and the Q value is 53,899.

From the results of the Q value, even though the entire length of the resonator element according to the first embodiment of the invention of FIG. 3 is shorter by 16% (=(345 μm−122 μm)/(1038 μm+345 μm)×100) than the entire length of the resonator element according to the related art of FIG. 2, the Q value of the first embodiment is remarkably higher than that of the related art. In the structure of the resonator element of FIG. 2, a vibration offset portion 82 is provided, which offsets the vibration (vibration in the X axis direction) which is leaked from each of the vibrating arms 20 and 22 and has opposite phases to each other. However, since a frame portion 84 extends from a region, in which the vibration is not sufficiently offset by the vibration offset portion 82, to an island portion 86 which is a fixing portion, the vibration leakage cannot be sufficiently reduced, and as a result, the Q value deteriorates. On the other hand, in the structure of the embodiment of the invention, the fixing portion is provided in the center portion of the main body portion 14 which does not include the frame portion and includes the reduced width portion 16, and thus, the vibration leakage is reduced, and the resonator element which can exhibit excellent vibration characteristics is realized.

In the structure of the embodiment of the invention, the reason why the vibration leakage is reduced depends on the following effects.

Figures 4A, 4B:
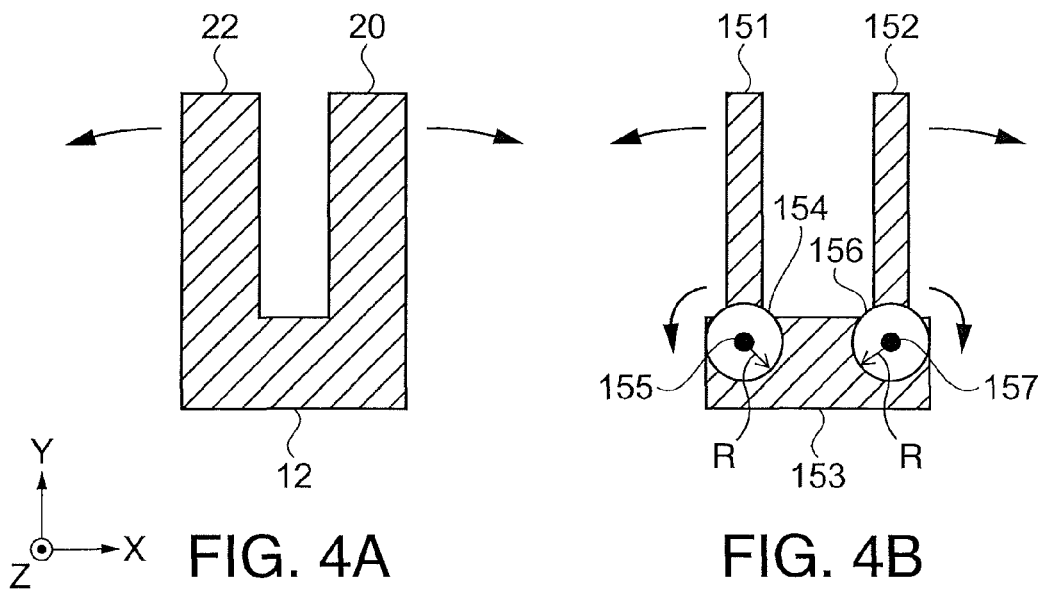

FIGS. 4A and 4B are plan views illustrating a principle of the vibration leak suppression, of which, FIG. 4A is a schematic plan view of the resonator element according to the related art, and FIG. 4B is a plan view of a simplified model. FIGS. 5A to 5D are views illustrating the principle of the vibration leak suppression, of which, FIG. 5A is an exploded view in which the connection portion is positioned in an upper portion, FIG. 5B is an exploded view in which the connection portion is positioned in a center, FIG. 5C is an exploded view in which the connection portion is positioned in a lower portion, and FIG. 5D is an exploded view in which the connection portion is positioned in a lower portion of a rotating body.

Figure 6A:
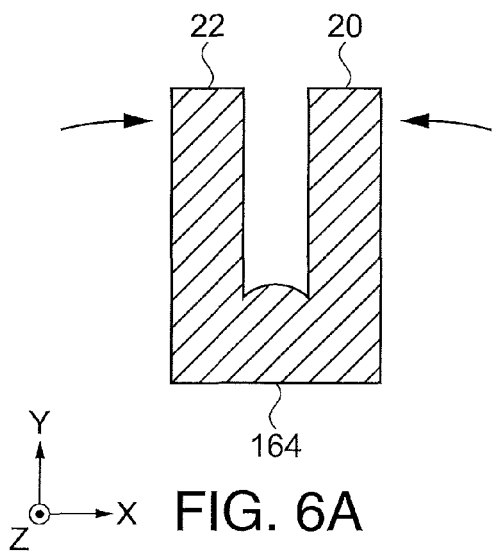
Figure 6B:
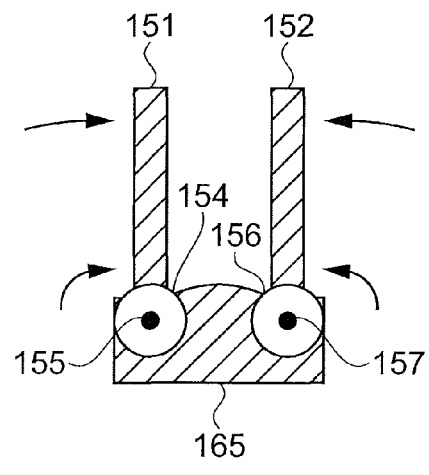
Figure 7A:
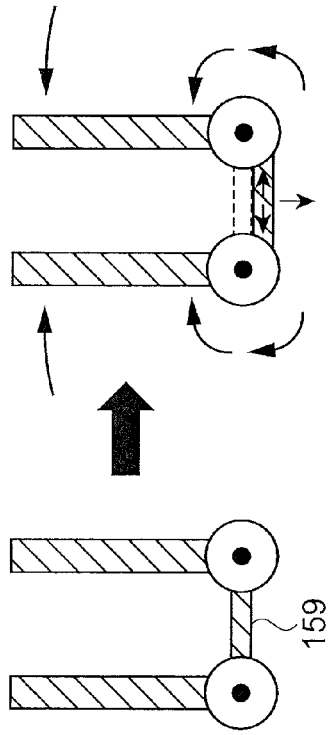
Figure 7B:
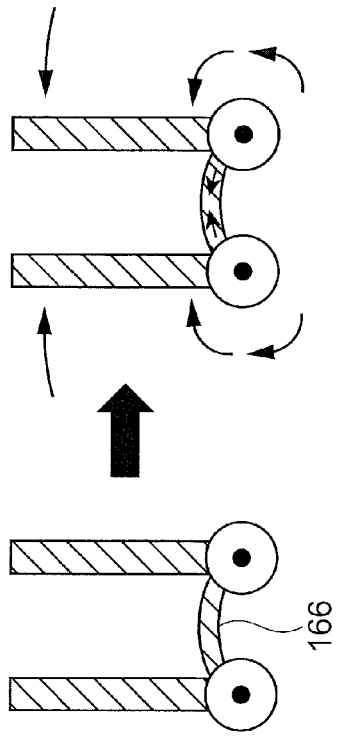
Figure 7C:
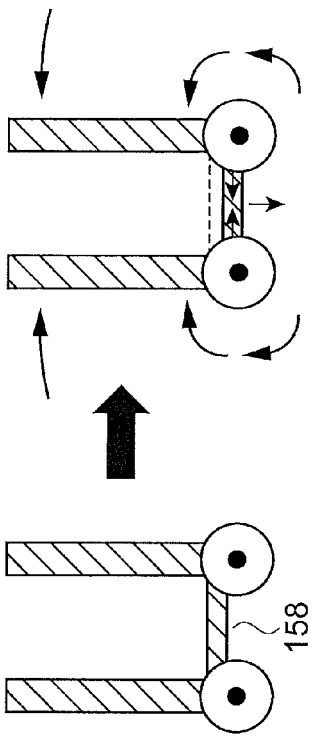
Figure 7D:
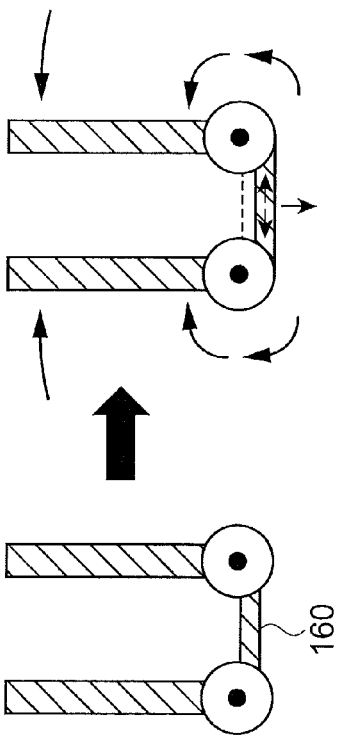

In addition, FIGS. 6A and 6B are plan views illustrating the principle of the vibration leak suppression, of which, FIG. 6A is a schematic plan view of the resonator element according to the first embodiment, and FIG. 6B is a plan view of a simplified model. FIGS. 7A to 7D are views illustrating the principle of the vibration leak suppression, of which, FIG. 7A is an exploded view in which a connection portion is positioned in an upper portion, FIG. 7B is an exploded view in which the connection portion is positioned in a center, FIG. 7C is an exploded view in which the connection portion is positioned in a lower portion, and FIG. 7D is an exploded view in which an arch-shaped connection portion is positioned in an upper portion of a rotating body.

In the Case of Structure of Base Portion According to the Related Art

First, in the case of a structure of the related art in which the reduced width portion does not exist as shown in FIG. 4A, as shown in FIG. 4B, an elastic rod 151 being connected to a pseudo rigid rotating body 154 having a predetermined radius R with a rotation axis 155 as the center of rotation and an elastic rod 152 being connected to a pseudo rigid rotating body 156 having a predetermined radius R with a rotation axis 157 as the center of rotation can be regarded as the elastic rods 151 and 152 being connected by a simplified base portion 153 (the reason will be described below).

Moreover, as shown in FIGS. 5A to 5D, as a representative connection portion of the simplified base portion 153, a first connection portion 158 which is provided to be closer to the sides of the elastic rods 151 and 152 than the rotation axes 155 and 157, a second connection portion 159 which is provided between the rotation axes 155 and 157, a third connection portion 160 which is provided to be closer to the side opposite to the direction, in which the elastic rod exists, than the rotation axes 155 and 157, and a fourth connection portion 161 which is provided to be closer to the side opposite to the direction, in which the elastic rod exists, than the third connection portion 160 are considered.

When two vibrating arms 20 and 22 are flexurally deformed to be separated from each other, it is regarded that the elastic rods 151 and 152 are flexurally deformed to be separated from each other. However, in this case, vortexes of displacement vectors are formed in a predetermined place in a direction opposite to a tip direction of the vibrating arm from around roots of the vibrating arms 20 and 22. Most cases, the center of the vortex is positioned around the root of each of the vibrating arms 20 and 22 including the base portion 12. However, the center may be positioned on a virtual space which is not included in the vibrating arms 20 and 22 or the region of the base portion 12.

Here, for convenience of description, the center of the vortex is included in the region of the base portion 12, distances from the elastic rods 151 and 152 to the center are the same as each other, and the center of the vortex is set to the rotation axes 155 and 157 in FIG. 4B. Moreover, displacement in a tangential direction of the outer circumference of each of the pseudo rigid rotating bodies 154 and 156, which have the rotation axes 155 and 157 as the centers of rotation and have the radius R, is the largest in the tip direction sides of the elastic rods 151 and 152, and is the smallest in the directions opposite to the tip directions of the elastic rods 151 and 152. Accordingly, it is represented by the "pseudo" rigid body.

In FIG. 5A, the first representative connection portion 158 of the simplified base portion 153 slightly moves to the tip directions of the elastic rods 151 and 152 while being strongly extended by the rotational movement of the pseudo rigid rotating bodies 154 and 156.

In FIG. 5B, similarly, the second representative connection portion 159 of the simplified base portion 153 also moves to the tip directions of the elastic rods 151 and 152 while being extended by the rotational movement of the pseudo rigid rotating bodies 154 and 156.

Moreover, in FIG. 5C, the third representative connection portion 160 of the simplified base portion 153 moves to the tip directions of the elastic rods 151 and 152 while being compressed by the rotational movement of the pseudo rigid rotating bodies 154 and 156, and at this time, a potential power, which is deformed in either the tip directions of the elastic rods 151 and 152 or directions opposite to the tip directions of the elastic rods 151 and 152, is provided in the vicinity of the center in the length direction (direction in which the elastic rods 151 and 152 are arranged) of the third connection portion 160.

Furthermore, in FIG. 5D, in the case of the fourth representative connection portion 161 of the simplified base portion 153, if pseudo rigid rotating bodies 162 and 163 which have a larger radius R' than the radius R and have the rotation axes 155 and 157 as the centers of rotation are newly considered, similar to the third representative connection portion 160 of the simplified base portion, the fourth connection portion slightly moves in tip directions of the elastic rods 151 and 152 while being slightly compressed by the rotational movement of the pseudo rigid rotating bodies 162 and 163. At this time, a potential power, which is deformed in either the tip directions of the elastic rods 151 and 152 or directions opposite to the tip directions of the elastic rods 151 and 152, is provided in the vicinity of the center in the length direction of the fourth connection portion 161.

Since all first to the fourth connection portions 158, 159, 160, and 161 move in tip directions of the elastic rods 151 and 152, the deformation according to the potential power included in the third and the fourth connection portions becomes deformation which is displaced to the tip sides of the elastic rods 151 and 152.

Therefore, in the first to fourth representative connection portions 158, 159, 160, and 161 of the simplified base portion 153, according to the separating movement of the elastic rods 151 and 152, an effect is exerted which offsets the vibration displacement while generating deformation of compression or extension in the direction in which the rotation axes 155 and 157 are connected to each other. Moreover, all the connection portions are displaced in directions of the tip sides of the elastic rods 151 and 152, and if a fixing member is formed in the simplified base portion 153, that is, if the fixing member is formed in the base portion 12, energy accompanying the displacement of the elastic rods 151 and 152 in the tip directions is leaked to the outside via the fixing member. The resultant is the vibration leakage, and the Q value deteriorates by an amount corresponding to the leaked energy.

In the Case Where Reduced Width Portion Exists in Upper Side (Side in which Vibrating Arm is Disposed) of Base Portion According to the Invention On the other hand, FIG. 6A shows the case where the reduced width portion according to the invention is formed on end portions of the sides in which the vibrating arms 20 and 22 of the base portion extend. Similar to the above, as shown in FIG. 6B, an elastic rod 151 being connected to a pseudo rigid rotating body 154 having a predetermined radius R with a rotation axis 155 as the center of rotation and an elastic rod 152 being connected to a pseudo rigid rotating body 156 having a radius R with a rotation axis 157 as the center of rotation can be regarded as the elastic rods 151 and 152 being connected by a simplified base portion 165.

Moreover, as shown in FIGS. 7A to 7D, as a representative connection portion of the simplified base portion 165, a first connection portion 158 which is provided to be closer to the sides of the elastic rods 151 and 152 than the rotation axes 155 and 157, a second connection portion 159 which is provided between the rotation axes 155 and 157, a third connection portion 160 which is provided to be closer to the side opposite to the direction, in which the elastic rod exists, than the rotation axes 155 and 157, and a fourth connection portion 166 which is provided to be closer in the tip direction of the elastic rod than the first connection portion 158 are considered.

When two vibrating arms 20 and 22 are flexurally deformed to approach each other, it is regarded that the elastic rods 151 and 152 are flexurally deformed to approach each other. However, in this case, vortexes of displacement vectors are formed in a predetermined place in a direction opposite to a tip direction of the vibrating arm from around roots of the vibrating arms 20 and 22. In most cases, the center of the vortex is positioned around the root of each of the vibrating arms 20 and 22 including the base portion 164. However, the center may be positioned on a virtual space which is not included in the vibrating arms 20 and 22 or the region of the base portion 164. Here, for convenience of description, the center of the vortex is included in the region of the base portion 164, distances from the elastic rods 151 and 152 to the center are the same as each other, and the center of the vortex is set to the rotation axes 155 and 157 in FIGS. 6A and 6B.

Moreover, displacement in a tangential direction of the outer circumference of each of the pseudo rigid rotating bodies 154 and 156, which have the rotation axes 155 and 157 as the centers of rotation and have the radius R, is the largest in the tip direction sides of the elastic rods 151 and 152, and is the smallest in the directions opposite to the tip directions of the elastic rods 151 and 152. Moreover, in this case, the displacement direction is opposite to that of the case where two vibrating arms 20 and 22 are separated from each other.

In FIG. 7A, the first representative connection portion 158 of the simplified base portion 165 slightly moves in directions opposite to the tip directions of the elastic rods 151 and 152 while being strongly compressed by the rotational movement of the pseudo rigid rotating bodies 154 and 156. At this time, a potential power, which is deformed in either the tip directions of the elastic rods 151 and 152 or directions opposite to the tip directions of the elastic rods 151 and 152, is provided in the vicinity of the center in the length direction of the first connection portion 158.

In FIG. 7B, similarly, the second representative connection portion 159 of the simplified base portion 165 also moves in directions opposite to the tip directions of the elastic rods 151 and 152 while being extended by the rotational movement of the pseudo rigid rotating bodies 154 and 156.

Moreover, in FIG. 7C, the third representative connection portion 160 of the simplified base portion 165 moves in the directions opposite to the tip directions of the elastic rods 151 and 152 while being extended by the rotational movement of the pseudo rigid rotating bodies 154 and 156.

Furthermore, in FIG. 7D, in the case of the fourth representative connection portion 166 of the simplified base portion 165, the connection portion is compressed by the rotational movement of the pseudo rigid rotating bodies 154 and 156. However, since the fourth connection portion has an arch shape, the fourth connection portion is not easily deformed, and further when the fourth connection portion is deformed, the vicinity of the center in the length direction of the fourth connection portion 166 is deformed to be displaced in the tip directions of the elastic rods 151 and 152.

Therefore, in the first to fourth representative connection portions 158, 159, 160, and 166 of the simplified base portion 165, according to the approaching movement of the elastic rods 151 and 152, an effect is exerted which offsets the vibration displacement while generating deformation of compression or extension in the direction in which the rotation axes 155 and 157 are connected to each other. Moreover, the first to the third connection portions 158, 159, and 160 being displaced in directions opposite to the tip directions of the elastic rods 151 and 152 are offset because of difficulty in the deformation of the fourth connection portion 166 and the vicinity of the center in the length direction of the fourth connection portion 166 being deformed to be displaced in the directions of the tip sides of the elastic rods 151 and 152.

As a result, when the fixing member is formed in the simplified base portion 165, that is, when the fixing member is formed in the base portion 164, since the energy which is leaked to the outside via the fixing member is reduced, the vibration leakage is reduced, and thus, the decrease of the Q value can be suppressed.

Second Embodiment

Next, a second embodiment of the invention will be described.

Figure 8:
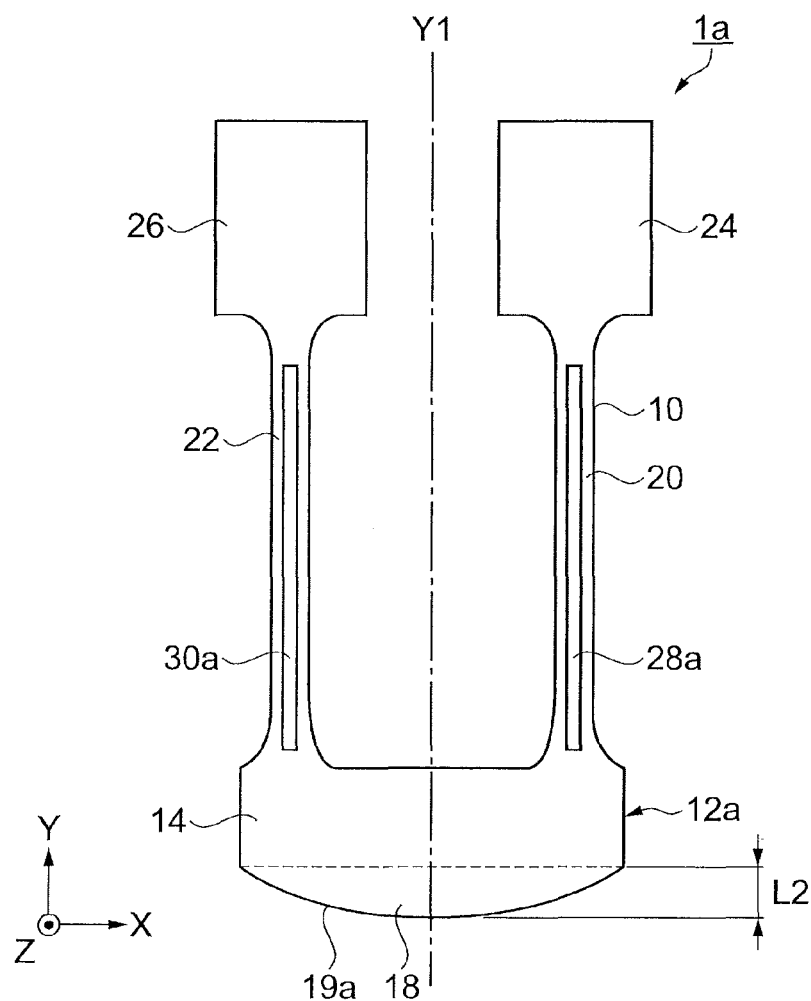
FIG. 8 is a plan view showing a structure of a resonator element according to a second embodiment of the invention.

FIG. 8 is a plan view of a resonator element according to the second embodiment of the invention.

Hereinafter, in the second embodiment, differences from the above-described first embodiment are mainly described, and the descriptions with respect to the similar matters are omitted.

The second embodiment is approximately similar to the first embodiment except that the configuration (shape) of the reduced width portion of the second embodiment is different from that of the first embodiment. Moreover, in FIG. 8, the same reference numerals are attached to the configurations similar to those of the above-described first embodiment.

In a resonator element 1a shown in FIG. 8, the reduced width portion 18 is disposed in the −Y axis direction of the main body portion 14, the contour of the reduced width portion 18 is configured of a curve portion 19a having a curved shape, and both ends of the curve portion 19a are connected to each corner in the −Y axis direction side of the main body portion 14. The curvature radius of the curve portion 19a is constant over the entire region.

By also providing the reduced width portion 18 having the above-described shape, similar to the above-described first embodiment, improvement of the vibration characteristics is demonstrated based on simulation results. Moreover, the resonator element used in this simulation is similar to that used in the above-described first embodiment except that the shape of the reduced width portion is different from that of the first embodiment.

In the resonator element 1a included in the embodiment, the dimensions of the vibrating arms 20 and 22 and the base portion 12a are the same as those of the first embodiment, a length L2 of the reduced width portion 18 is 40 μm, and the contour of the reduced width portion 18 is configured of the curve portion 19a having a constant curvature radius. The Q value of the resonator element 1a is 43,362, which is remarkably high compared to that of the resonator element (Q value is 38, 230) of the related art. Accordingly, compared to the related art, in the embodiment including the resonator element in which the reduced width portion 18 having the contour of the curved shape is configured in the outer edge in the −Y axis direction side of the main body portion 14 which supports and connects the vibrating arms 20 and 22, it is found that the vibration leakage is reduced and improved vibration characteristics can be exhibited.

The reason depends on the following effects.

Figures 9A, 9B:
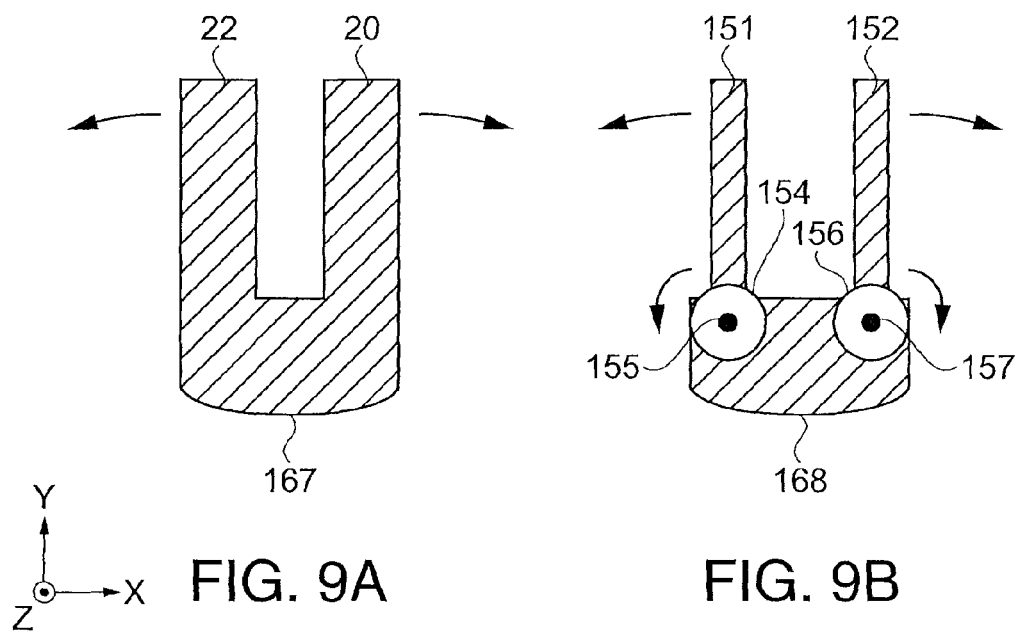
Figure 10A:
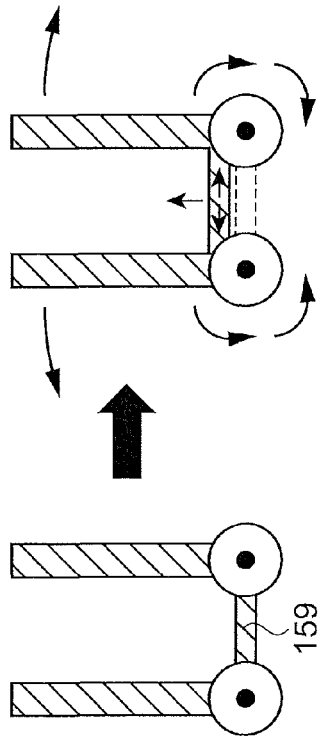
Figure 10B:
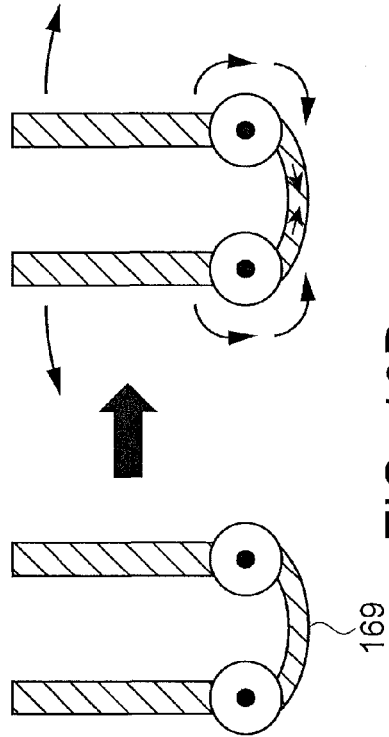
Figure 10C:
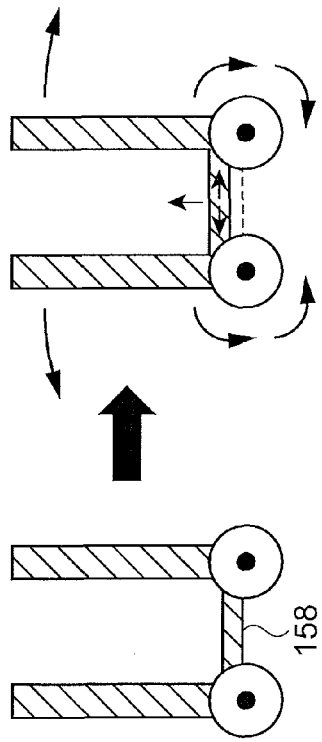
Figure 10D:
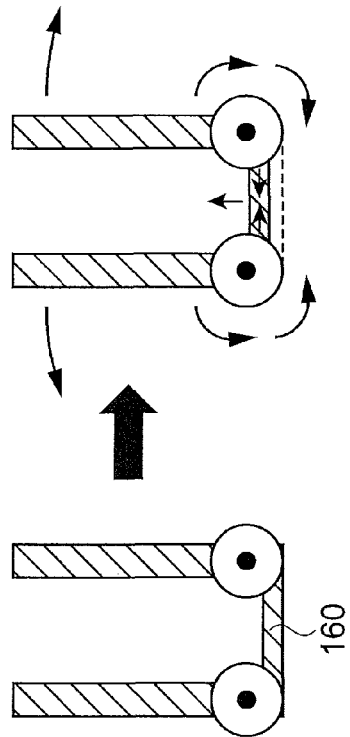

FIGS. 9A and 9B are plan views illustrating the principle of the vibration leak suppression, of which, FIG. 9A is a schematic plan view of the resonator element according to the second embodiment, and FIG. 9B is a plan view of a simplified model. FIGS. 10A to 10D are views illustrating the principle of the vibration leak suppression, of which, FIG. 10A is an exploded view in which a connection portion is positioned in an upper portion, FIG. 10B is an exploded view in which the connection portion is positioned in the center, FIG. 10C is an exploded view in which the connection portion is positioned in a lower portion, and FIG. 10D is an exploded view in which an arch-shaped connection portion is positioned in a lower portion of a rotating body.

In the Case Where Reduced Width Portion Exists in Lower Side (Side in which Vibrating Arm is not Disposed) of Base Portion According to the Invention FIG. 9A shows the case where the reduced width portion according to the invention is formed in the side opposite to the tip directions of the vibrating arms 20 and 22. Similar to the above, as shown in FIG. 9B, the elastic rod 151 being connected to the pseudo rigid rotating body 154 having a predetermined radius R with the rotation axis 155 as the center of rotation and the elastic rod 152 being connected to the pseudo rigid rotating body 156 having a radius R with the rotation axis 157 as the center of rotation can be regarded as the elastic rods 151 and 152 being connected by the simplified base portion 168.

Moreover, as a representative connection portion of the simplified base portion 168, the first connection portion 158 which is provided to be closer to the sides of the elastic rods 151 and 152 than the rotation axes 155 and 157, the second connection portion 159 which is provided between the rotation axes 155 and 157, the third connection portion 160 which is provided to be closer to the side opposite to the direction, in which the elastic rod exists, than the rotation axes 155 and 157, and a fourth connection portion 169 which is provided to be closer to the side opposite to the tip direction of the elastic rod than the third connection portion 160 are considered.

When two vibrating arms 20 and 22 are flexurally deformed to be separated from each other, it is regarded that the elastic rods 151 and 152 are flexurally deformed to be separated from each other. However, in this case, vortexes of displacement vectors are formed in a predetermined place in the direction opposite to the tip direction of the vibrating arm from around roots of the vibrating arms 20 and 22. In most cases, the center of the vortex is positioned around the root of each of the vibrating arms 20 and 22 including the base portion 167. However, the center may be positioned on a virtual space which is not included in the vibrating arms 20 and 22 or the region of the base portion 167.

Here, for convenience of description, the center of the vortex is included in the region of the base portion 167, the distances from the elastic rods 151 and 152 to the center are the same as each other, and the center of the vortex is set to the rotation axes 155 and 157 in FIG. 9B. Moreover, displacement in a tangential direction of the outer circumference of each of the pseudo rigid rotating bodies 154 and 156, which have the rotation axes 155 and 157 as the centers of rotation and have the radius R, is the largest in the tip direction sides of the elastic rods 151 and 152, and is the smallest in the directions opposite to the tip directions of the elastic rods 151 and 152.

In FIG. 10A, the first representative connection portion 158 of the simplified base portion 168 slightly moves in the directions of the tip sides of the elastic rods 151 and 152 while being strongly extended by the rotational movement of the pseudo rigid rotating bodies 154 and 156.

In FIG. 10B, similarly, the second representative connection portion 159 of the simplified base portion 168 also moves in the directions of the tip sides of the elastic rods 151 and 152 while being extended by the rotational movement of the pseudo rigid rotating bodies 154 and 156.

In FIG. 10C, the third representative connection portion 160 of the simplified base portion 168 moves in the directions of the tip sides of the elastic rods 151 and 152 while being compressed by the rotational movement of the pseudo rigid rotating bodies 154 and 156. However, at this time, a potential power, which is deformed in either the directions of the tip sides of the elastic rods 151 and 152 or directions opposite to the directions of the tip sides of the elastic rods 151 and 152, is provided in the vicinity of the center in the length direction of the third connection portion 160.

In FIG. 10D, in the case of the fourth representative connection portion 169 of the simplified base portion 168, the connection portion is compressed by the rotational movement of the pseudo rigid rotating bodies 154 and 156. However, since the fourth connection portion has an arch shape, the fourth connection portion is not easily deformed, and further when the fourth connection portion is deformed, the vicinity of the center in the length direction of the fourth connection portion 169 is deformed to be displaced in directions opposite to the tip directions of the elastic rods 151 and 152.

Therefore, in the first to fourth representative connection portions 158, 159, 160, and 169 of the simplified base portion 168, according to the separating movement of the elastic rods 151 and 152, an effect is exerted which offsets the vibration displacement while generating deformation of compression or extension in the direction in which the rotation axes 155 and 157 are connected to each other. Moreover, the first to the third connection portions 158, 159, and 160 being displaced in the directions of the tip sides of the elastic rods 151 and 152 are offset because of difficulty in the deformation of the fourth connection portion 169 and the vicinity of the center in the length direction of the fourth connection portion 169 being deformed to be displaced in the directions opposite to the tip directions of the elastic rods 151 and 152.

As a result, when the fixing member is formed in the simplified base portion 168, that is, when the fixing member is formed in the base portion 167, since the energy which is leaked to the outside via the fixing member is reduced, the vibration leakage is reduced, and thus, the decrease of the Q value can be suppressed.

If the structure of the base portion of the resonator element according to the related art disclosed in JP-A-2005-236563 is considered based on the effects of the above-described mechanism, in FIG. 2, since the frame portion 84 is connected to the vibrating arms and the root portions which are regions, in which the vibration is not offset or is not suppressed, the vibration leakage occurs in the connection portion between the vibrating arms and the root portions, and the frame portion 84. Accordingly, the frame portion 84 also vibrates along with the flexural vibration of the vibrating arms. Therefore, when the island portion 86 of the other end of the frame portion is set to the fixing portion, the island portion 86 vibrates in the Y axis direction, and as a result, there are problems that the vibration leakage is not reduced and the Q value is deteriorated.

Third Embodiment

Next, a third embodiment of the invention will be described.

Figure 11:
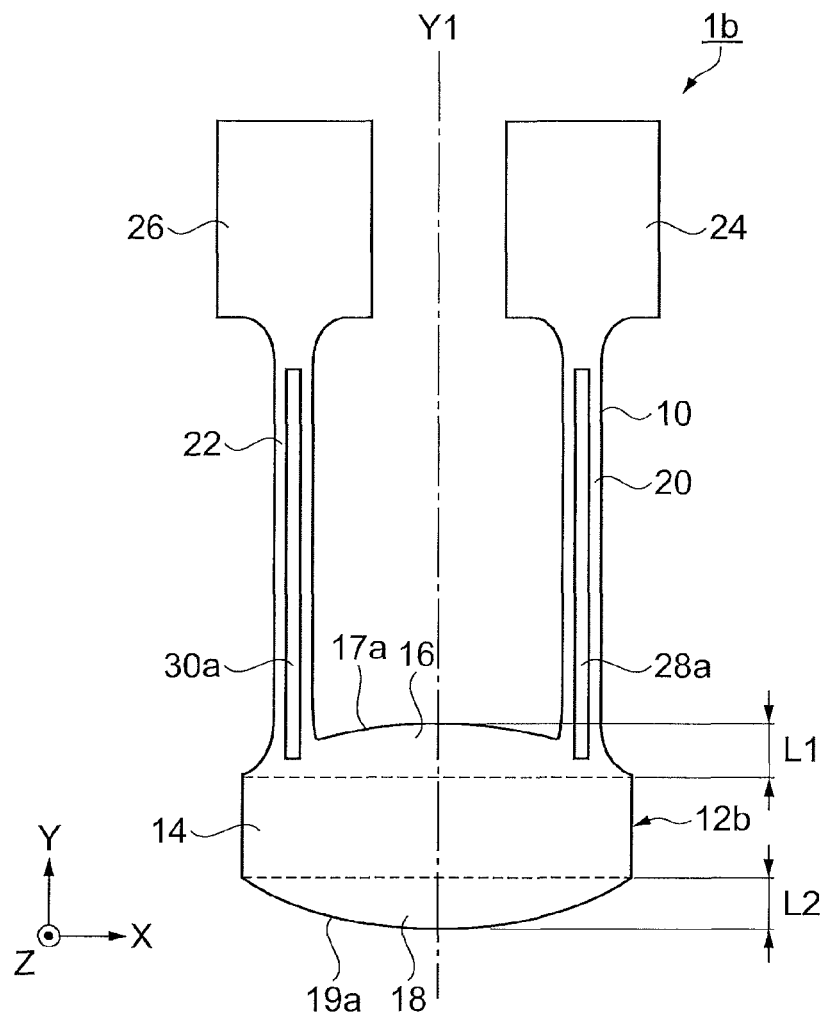
FIG. 11 is a plan view showing a structure of a resonator element according to a third embodiment of the invention.

FIG. 11 is a plan view of a resonator element according to the third embodiment of the invention.

Hereinafter, in the third embodiment, differences from the above-described first embodiment are mainly described, and the descriptions with respect to the similar matters are omitted.

The third embodiment is approximately similar to the first embodiment except that the configuration (shape) of the reduced width portion of the third embodiment is different from that of the first embodiment. Moreover, in FIG. 11, the same reference numerals are attached to the configurations similar to those of the above-described first embodiment.

In a resonator element 1b shown in FIG. 11, the base portion 12b includes the main body portion 14, the reduced width portion 16 which is positioned in the +Y axis direction side of the main body portion 14, and the reduced width portion 18 which is positioned in the −Y axis direction side of the main body portion 14. In other words, the base portion 12b of the embodiment includes two reduced width portions 16 and 18 which are disposed so as to be opposite to each other via the main body portion 14.

In the resonator element 1b, since two reduced width portions 16 and 18 are provided, the vibration leakage can be more effectively suppressed. Specifically, in the vibration of the vibrating arms 20 and 22, when the vibrating arms 20 and 22 approach each other, the displacement to the −Y axis direction side of the main body portion 14 is mainly suppressed by the reduced width portion 16, when the vibrating arms 20 and 22 are separated from each other, the displacement to the +Y axis direction side of the main body portion 14 is mainly suppressed by the reduced width portion 18, and thus, the vibration leakage can be more effectively suppressed.

Similar to the above-described first embodiment, also with respect to the resonator element 1b having the shape in which two reduced width portions 16 and 18 are provided, improvement of the vibration characteristics is demonstrated based on the simulation results. Moreover, the resonator element used in this simulation is similar to that used in the above-described first embodiment except that the shape of the reduced width portion 18 is added.

In the resonator element 1b included in the embodiment, the length L1 of the reduced width portion 16 is 42 μm, the length L2 of the reduced width portion 18 is 40 μm, and the contours of the reduced width portions 16 and 18 are configured of the curve portions 17a and 19a having a constant curvature radius. The Q value of the resonator element 1b is 156,211, which is remarkably high by about 4 times compared to that of the resonator element (Q value is 38,230) according to the related art. Accordingly, in the embodiment, two reduced width portions 16 and 18 which are disposed so as to be opposite to each other via the main body portion 14 and have contours of curve shapes are provided, and compared to the related art, it is found that the vibration leakage is remarkably properly suppressed and improved vibration characteristics can be exhibited.

The reason is because the height (length in the Y axis direction) of the center portion of the base portion 12b is increased by providing the reduced width portions 16 and 18 in both sides in the Y axis direction of the base portion 12b, stiffness in both directions of the Y axis is increased, and bending is difficult. Accordingly, the deformation, which is generated when the tip portions of two vibrating arms 20 and 22 approach each other or are separated from each other, in both directions of the Y axis of the base portion 12b can be significantly reduced, and thus, the vibration leakage can be more effectively reduced, which contributes to remarkable improvement of the Q value.

Fourth Embodiment

Next, a fourth embodiment of the invention will be described.

Figure 12:
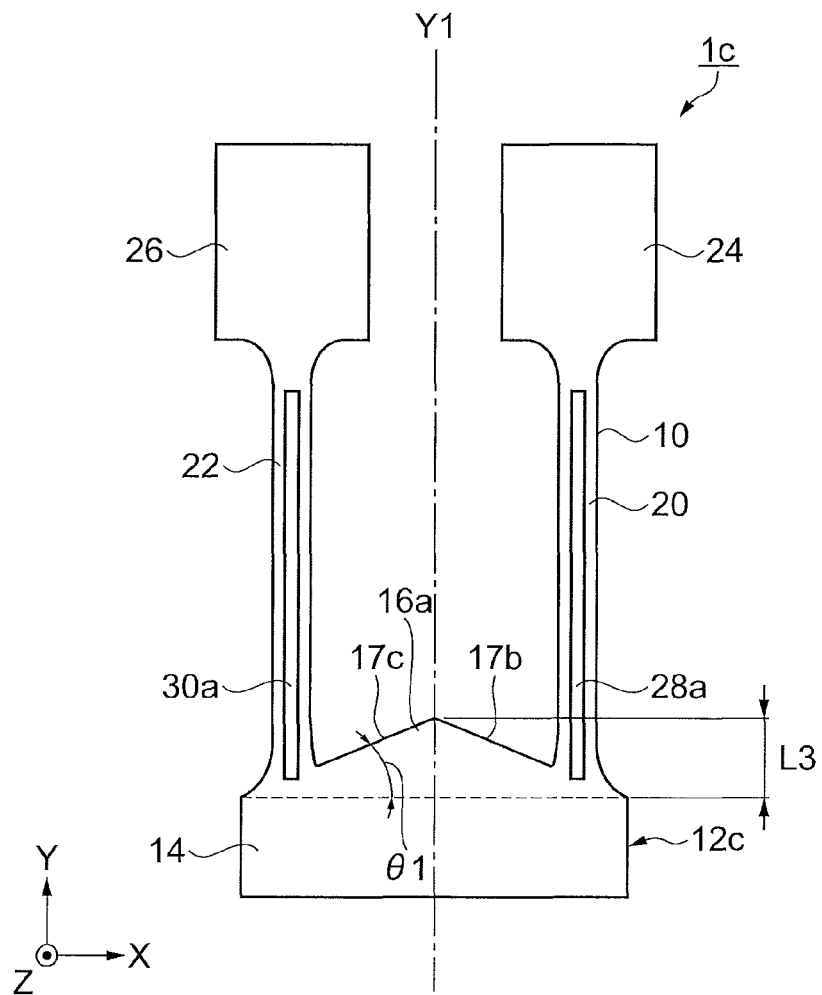
FIG. 12 is a plan view showing a structure of a resonator element according to a fourth embodiment of the invention.

FIG. 12 is a plan view of a resonator element according to the fourth embodiment of the invention.

Hereinafter, in the fourth embodiment, differences from the above-described first embodiment are mainly described, and the descriptions with respect to the similar matters are omitted.

The fourth embodiment is approximately similar to the first embodiment except that the configuration (shape) of the reduced width portion of the fourth embodiment is different from that of the first embodiment. Moreover, in FIG. 12, the same reference numerals are attached to the configurations similar to those of the above-described first embodiment.

In a resonator element 1c shown in FIG. 12, a reduced width portion 16a is disposed in the +Y axis direction side of the main body portion 14 in the base portion 12c, the contour of the reduced width portion 16a is configured of linear inclined portions 17b and 17c which are inclined to both axes of the X axis and the Y axis in a plan view, and ends (ends of the +Y axis direction side) of the inclined portions 17b and 17c are connected to each other at the virtual center line Y1 intersecting the first end portion parallel to the Y axis. Accordingly, the reduced width portion 16a has a corner at the tip portion and is sharpened. The reduced width portion 16a is configured as described above, and thus, similar to the first embodiment in which the reduced width portion 16 has a curved shape, the vibration leakage can be effectively suppressed, and simplification of the configuration of the reduced width portion can be realized.

Moreover, an angle θ1 between the inclined portions 17b and 17c of the reduced width portion 16a having a length L3 and the X axis is not particularly limited, and for example, preferably, approximately 5° or more and 70° or less.

Furthermore, when the vibration substrate 10 is patterned by wet-etching a quartz crystal substrate, since crystal planes of the quartz crystal appear on the contour of the vibration substrate 10, if the inclined portions 17b and 17c parallel to the crystal planes are formed and patterned using a photomask, variations of shapes are decreased, and stable performance can be obtained. Particularly, the inclined portions may be parallel to the crystal planes which form 30° or 60° with respect to the X axis of the quartz crystal.

Also in the fourth embodiment, effects similar to those of the above-described first embodiment can be exerted.

Fifth Embodiment

Next, a fifth embodiment of the invention will be described.

Figure 13:
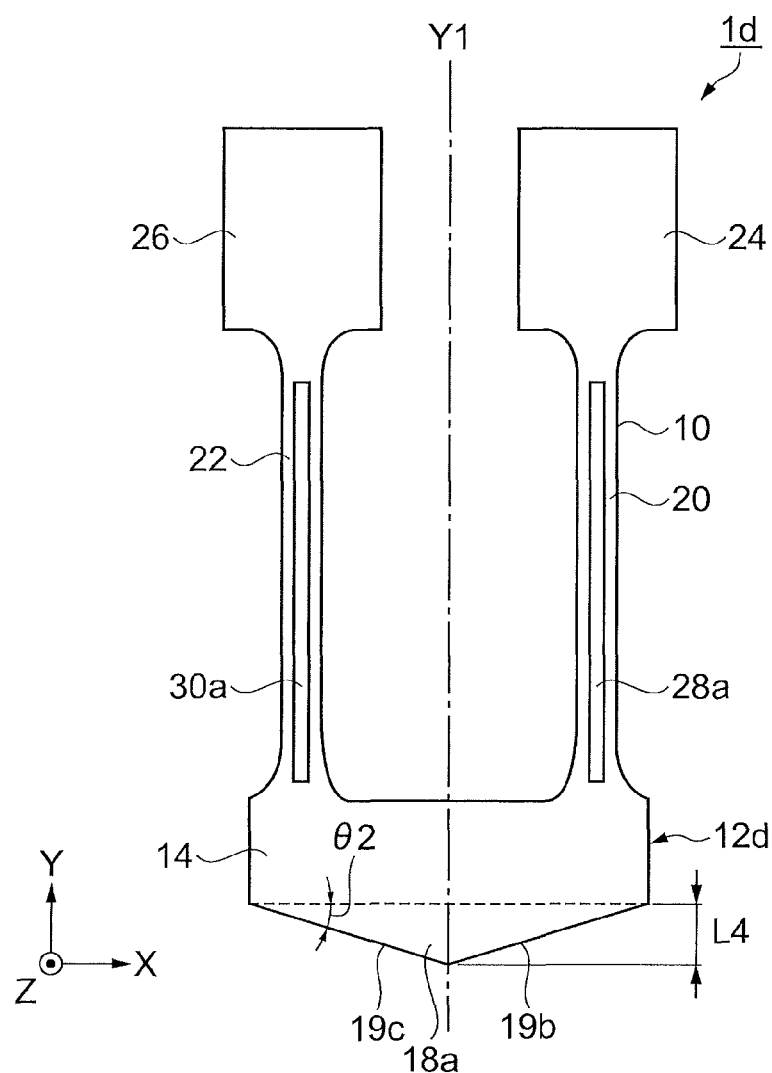
FIG. 13 is a plan view showing a structure of a resonator element according to a fifth embodiment of the invention.

FIG. 13 is a plan view of a resonator element according to the fifth embodiment of the invention.

Hereinafter, in the fifth embodiment, differences from the above-described first embodiment are mainly described, and the descriptions with respect to the similar matters are omitted.

The fifth embodiment is approximately similar to the first embodiment except that the configuration (shape) of the reduced width portion of the fifth embodiment is different from that of the first embodiment. Moreover, in FIG. 13, the same reference numerals are attached to the configurations similar to those of the above-described first embodiment.

In a resonator element 1d shown in FIG. 13, a reduced width portion 18a is disposed in the −Y axis direction side of the main body portion 14 in the base portion 12d, the contour of the reduced width portion 18a is configured of linear inclined portions 19b and 19c which are inclined to both axes of the X axis and the Y axis in a plan view, and ends (ends of the −Y axis direction side) of the inclined portions 19b and 19c are connected to each other at the virtual center line Y1. Accordingly, the reduced width portion 18a has a corner at the tip portion and is sharpened, and similar to the second embodiment in which the reduced width portion 18 has the curved shape, the vibration leakage can be effectively suppressed, and simplification of the configuration of the reduced width portion can be improved.

Moreover, an angle θ2 between the inclined portions 19b and 19c of the reduced width portion 18a having a length L4 and the X axis is not particularly limited, and for example, from the viewpoint of suppressing an excessive increase in the size of the reduced width portion 18a, the angle θ2 is preferably, 5° or more and 70° or less, and more preferably, 10° or more and 50° or less.

Furthermore, when the vibration substrate 10 is patterned by wet-etching a quartz crystal substrate, since crystal planes of the quartz crystal appear on the contour of the vibration substrate 10, if the inclined portions 19b and 19c parallel to the crystal planes are formed and patterned using a photomask, variations of shapes are decreased, and stable performance can be obtained.

Also in the fifth embodiment, effects similar to those of the above-described first embodiment can be exerted.

Sixth Embodiment

Next, a sixth embodiment of the invention will be described.

Figure 14:
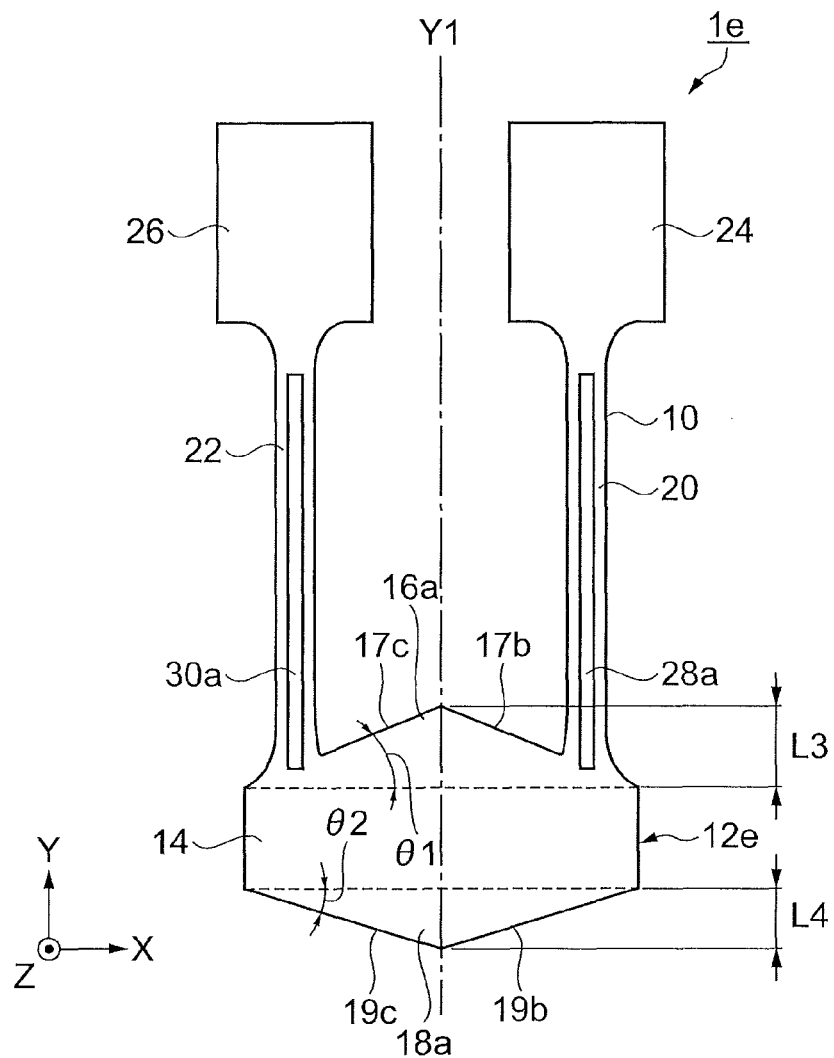
FIG. 14 is a plan view showing a structure of a resonator element according to a sixth embodiment of the invention.

FIG. 14 is a plan view of a resonator element according to the sixth embodiment of the invention.

Hereinafter, in the sixth embodiment, differences from the above-described first embodiment are mainly described, and the descriptions with respect to the similar matters are omitted.

The sixth embodiment is approximately similar to the first embodiment except that the configuration (shape) of the reduced width portion of the sixth embodiment is different from that of the first embodiment. Moreover, in FIG. 14, the same reference numerals are attached to the configurations similar to those of the above-described first embodiment.

In a resonator element 1e shown in FIG. 14, a base portion 12e includes the main body portion 14, the reduced width portion 16a which is positioned in the +Y axis direction side of the main body portion 14, and the reduced width portion 18a which is positioned in the −Y axis direction side of the main body portion 14. In other words, the base portion 12e of the embodiment includes two reduced width portions 16a and 18a which are disposed so as to be opposite to each other via the main body portion 14.

The contour of the reduced width portion 16a is configured of linear inclined portions 17b and 17c which are inclined to both axes of the X axis and the Y axis in a plan view, and ends (ends in the +Y axis direction side) of the inclined portions 17b and 17c are connected to each other on the virtual center line Y1. In addition, the contour of the reduced width portion 18a is configured of linear inclined portions 19b and 19c which are inclined to both axes of the X axis and the Y axis in a plan view, and ends (ends in the −Y axis direction side) of the inclined portions 19b and 19c are connected to each other on the virtual center line Y1.

Accordingly, the reduced width portion 16a and 18a have corners at the tip portions and are formed to be sharpened, and thus, similar to the third embodiment in which the reduced width portions 16 and 18 have curved shapes, two reduced width portions 16a and 18a in which respective lengths are L3 and L4 are provided, and the vibration leakage can be effectively suppressed.

Also in the sixth embodiment, effects similar to those of the above-described first embodiment can be exerted.

Seventh Embodiment

Next, a seventh embodiment of the invention will be described.

Figure 15:
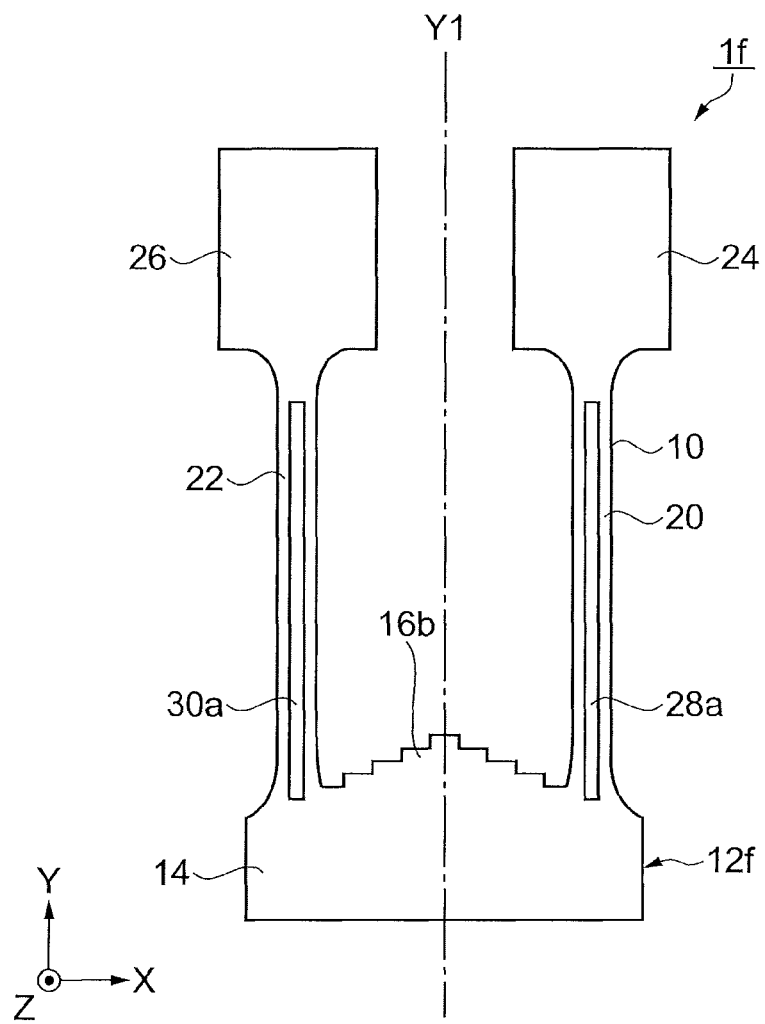
FIG. 15 is a plan view showing a structure of a resonator element according to a seventh embodiment of the invention.

FIG. 15 is a plan view of a resonator element according to the seventh embodiment of the invention.

Hereinafter, in the seventh embodiment, differences from the above-described first embodiment are mainly described, and the descriptions with respect to the similar matters are omitted.

The seventh embodiment is approximately similar to the first embodiment except that the configuration (shape) of the reduced width portion of the seventh embodiment is different from that of the first embodiment. In addition, in FIG. 15, the same reference numerals are attached to the configurations similar to those of the above-described first embodiment.

As shown in FIG. 15, the contour of the reduced width portion 16b of a resonator element if according to the invention is not limited to curve or linear inclined portions in a plan view, and may be configured of stepwise steps including a plurality of steps.

By also providing the reduced width portion 16b, similar to the above-described first embodiment, improvement of the vibration characteristics is demonstrated according to simulation analysis, and it is confirmed that the deterioration of the Q value due to the vibration leakage is more improved and further suppressed than the resonator element according to the related art.

Accordingly, the contour (outer edge) includes the reduced width portion 16b configured of a stepwise step as the seventh embodiment, and it is found that the vibration leakage is suppressed and improved vibration characteristics can be exhibited. It is needless to say that the reduced width portion 16b may be provided in either one end portion of the base portion or the other end portion or may be provided in both end portions.

Eighth Embodiment

Next, an eighth embodiment of the invention will be described.

Figure 16A:
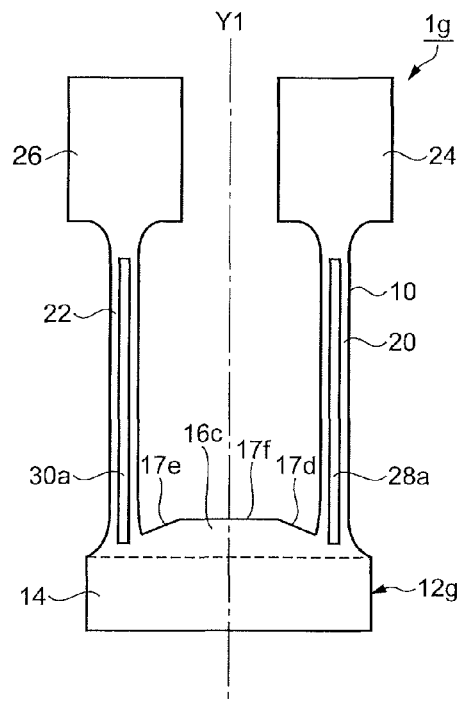
FIGS. 16A to 16C are plan views showing a structure of a resonator element according to an eighth embodiment of the invention.
Figure 16B:
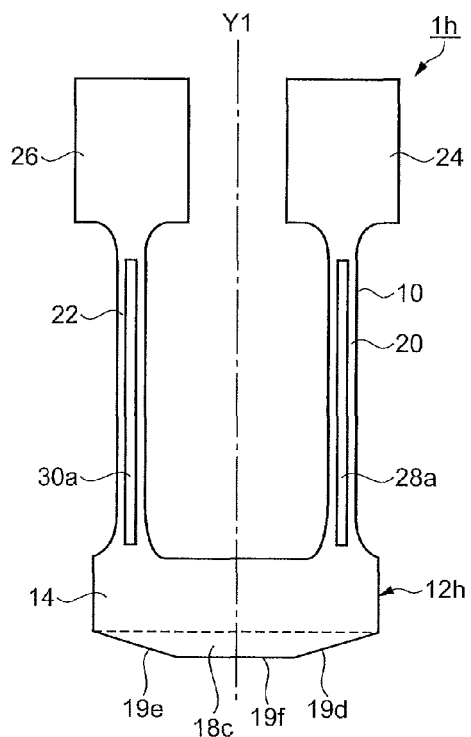
Figure 16C:
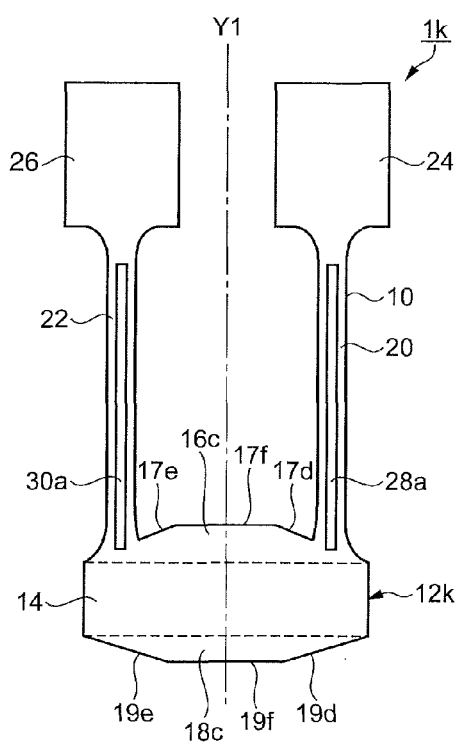

FIGS. 16A to 16C are Modification Examples of the invention and plan views of a resonator element according to the eighth embodiment, FIG. 16A shows First Modification Example, FIG. 16B shows Second Modification Example, and FIG. 16C is Third Modification Example.

Hereinafter, in the eighth embodiment, differences from the above-described first embodiment are mainly described, and the descriptions with respect to the similar matters are omitted.

The eighth embodiment is approximately similar to the first embodiment except that the configuration (shape) of the reduced width portion of the eighth embodiment is different from that of the first embodiment. Moreover, in FIGS. 16A to 16C, the same reference numerals are attached to the configurations similar to those of the above-described first embodiment.

In resonator elements 1g and 1k shown in FIGS. 16A to 16C, the contour of the reduced width portion 16c includes linear or curve inclined portions 17d and 17e which are inclined to both axes of the X axis and the Y axis in a plan view, and a connection portion 17f which connects ends in the +Y axis (−Y axis) direction side of the inclined portions 17d and 17e and is parallel to the X axis. Furthermore, in resonator elements 1h and 1k shown in FIGS. 16A to 16C, the contour of the reduced width portion 18c includes linear or curve inclined portions 19d and 19e which are inclined to both axes of the X axis and the Y axis in a plan view, and a connection portion 19f which connects ends in the +Y axis (−Y axis) direction side of the inclined portions 19d and 19e and is parallel to the X axis.

By also providing the reduced width portions 16c and 18c, similar to the above-described first embodiment, improvement of the vibration characteristics is demonstrated according to simulation analysis, and it is confirmed that the deterioration of the Q value due to the vibration leakage is more improved and further suppressed than the resonator element according to the related art.

Accordingly, also by providing reduced width portions 16c and 18c configured as the eighth embodiment, it is found that the vibration leakage is suppressed and improved vibration characteristics can be exhibited.

Next, when the resonator element according to the invention is mounted on a package, a relationship between a position of a joining member 35 and the Q value (Q value calculated by considering only the vibration leakage) will be described.

Moreover, the resonator element used in the simulation is the resonator element according to the third embodiment of the invention, and the joining member 35 is a silicon-based conductive adhesive having a diameter of 70 μm. Furthermore, in the descriptions below, for convenience of description, the joining member 35 is referred to as the adhesive.

FIGS. 17A and 17B are views showing a relationship between a center position of the adhesive and the Q value when the base portion of the resonator element according to the third embodiment of the invention is bonded at two locations different from each other in a vertical direction (Y direction), of which, FIG. 17A is a plan view showing the position of the adhesive when the resonator element is bonded at two points in the vertical direction, and FIG. 17B is a view showing the relationship between an adhesive center position Xa and the Q value.

The adhesive center position Xa is represented by the following Expression (1).

$$Xa = X1/(W/2) \times 100 (\%) \tag{1}$$

Here, the X1 indicates the length from a center line Y1 in the X axis direction of the base portion of the resonator element to the center position of the adhesive, and W is a width size (a length in the X axis direction) of the base portion of the resonator element. That is, deviation of the center position of the adhesive from the center line of the base portion is represented by percentage (%) with respect to the half of the width of the base portion of the resonator element.

From FIGS. 17A and 17B, when the adhesives are bonded so as to be arranged at two locations in the Y axis direction of the base portion of the resonator element, it is confirmed that the resonator element according to the third embodiment of the invention is more improved than the Q value (=38,230) of the resonator element (refer to JP-A-2005-236563) according to the related art shown in FIG. 2 in a range in which the adhesive center position Xa is from 0% to approximately 45%.

FIGS. 18A and 18B are views showing a relationship between the center position of the adhesive and the Q value when the base portion of the resonator element according to the third embodiment of the invention is bonded at two locations different from each other in a horizontal direction (X direction), of which, FIG. 18A is a plan view showing the position of the adhesive when the resonator element is bonded at two points in the horizontal direction, and FIG. 18B is a view showing the relationship between the adhesive center position Xa and the Q value.

In FIGS. 18A and 18B, in the structure in which the adhesives are bonded so as to be arranged at two locations in the X axis direction of the base portion of the resonator element, the Q value is calculated by setting each of the center positions of two adhesives to be separated with the same length from the base portion center line. As a result, it is confirmed that the resonator element according to the invention is more improved than the Q value (=38,230) of the resonator element (refer to JP-A-2005-236563) according to the related art shown in FIG. 2 in a range in which the adhesive center position Xa is from 18% to approximately 45%.

Figure 19A:
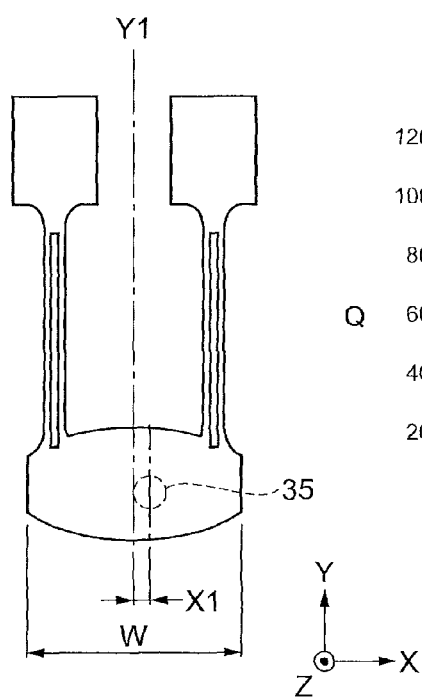
Figure 19B:
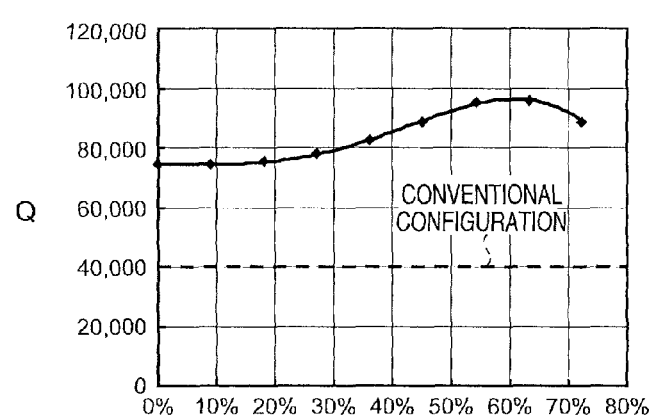

FIGS. 19A and 19B are views showing a relationship between the center position of the adhesive and the Q value when the base portion of the resonator element according to the third embodiment of the invention is bonded at one location, of which, FIG. 19A is a plan view showing the position of the adhesive when the resonator element is bonded at one point, and FIG. 19B is a view showing the relationship between the adhesive center position Xa and the Q value.

From FIGS. 19A and 19B, when the adhesive is bonded at one point, it is confirmed that the resonator element according to the third embodiment of the invention is more improved than the Q value (=38,230) of the resonator element (refer to JP-A-2005-236563) according to the related art shown in FIG. 2 over approximately all areas.

From the above results, a dimension relationship between the vibrating arm and the base portion of the resonator element suitable for exerting the effects of the invention will be described with reference to FIG. 3. Moreover, the Lb indicates the entire length (including the weight portion) of the vibrating arm, Ws indicates a distance between centers of two vibrating arms, and the L indicates the length from the connection portion of the vibrating arms 20 and 22 of the base portion 12 to the end portion opposite to the connection portion of the base portion 12.

(a) It is preferable that Lb>Ws be satisfied.

When the width of the base portion 12 is too wide in the X axis direction, the base portion 12 is greatly flexurally deformed, and in order to reduce the vibration leakage from being increased, it is preferable that Lb>Ws be satisfied.

Accordingly, the vibration leakage can be reduced.

(b) It is preferable that the vibration of the vibrating arm be an in-plane flexural basic mode.

Since the wavelength is short in an in-plane flexural higher mode, the base portion is greatly flexurally deformed, and there is a concern that the vibration leakage may be increased.

Accordingly, in order to reduce the vibration leakage, it is preferable that the vibration of the vibrating arm be the in-plane flexural basic mode.

Accordingly, the vibration leakage can be reduced.

(c) It is preferable that L<Ws be satisfied.

According to the invention, it is demonstrated that the vibration leakage is significantly smaller than the resonator element according to the related art.

Accordingly, the vibration leakage can be reduced even in the structure in which L<Ws is satisfied, and thus, the length in the Y axis direction of the resonator element can be shortened.

Electrode Configuration

Next, an electrode configuration of the resonator element according to the invention will be described.

FIGS. 20A to 20D are schematic views showing an example in which an electrode is wired on the resonator element according to the first embodiment of the invention, of which, FIG. 20A is an electrode wiring diagram of a front surface (a plane when viewed from the +Z axis direction), FIG. 20B is a cross-sectional view taken along B-B line in FIG. 20A, FIG. 20C is an electrode wiring diagram of a rear surface (a plane when viewed from the −Z axis direction), and FIG. 20D is a cross-sectional view taken along C-C line in FIG. 20C.

The electrode is formed on the front surface, the rear surface, and the side surfaces which are principle surfaces of the resonator element, and is configured of excitation electrodes 41a and 41b formed on the vibrating arms, lead-out electrodes 42a and 42b formed on the base portion or the weight portion, and pad electrodes 43a and 43b formed on the base portion. The excitation electrodes 41a and 41b which are driving electrodes are formed in the groove and the side surface of the vibrating arm and a driving voltage is applied to the excitation electrodes, and thus, at the time of driving, electric field efficiency of the inner portion of each vibrating arm can be increased.

Moreover, the pad electrodes 43a and 43b, which are electrode portions for connecting connection electrodes (not shown) formed on the package, are formed in the vicinity of the center of the base portion of the resonator element 2. Each of the lead-out electrodes 42a and 42b connected to each of the pad electrodes 43a and 43b wraps around the outer edge of the base portion, is provided on the front and the rear of the base portion of the resonator element 2, and is connected to each of the excitation electrodes 41a and 41b. Accordingly, the driving voltage is applied to the excitation electrodes 41a and 41b through the lead-out electrodes 42a and 42b from the pad electrodes 43a and 43b, and thus, an electric field is appropriately formed in the vibrating arms of the resonator element, and the vibrating arms vibrate with a predetermined frequency in an in-plane direction (XY plane direction) so that each tip portion of two vibrating arms repeats mutual approaching and separating.

Furthermore, the configurations of the excitation electrodes 41a and 41b, the lead-out electrodes 42a and 42b, and the pad electrodes 43a and 43b are not particularly limited, and may use metal materials such as gold (Au), gold alloy, platinum (Pt), silver (Ag), silver alloy, chromium (Cr), or chromium alloy.

Resonator

Next, the resonator to which the resonator element according to the invention is applied will be described.

Figure 21A:
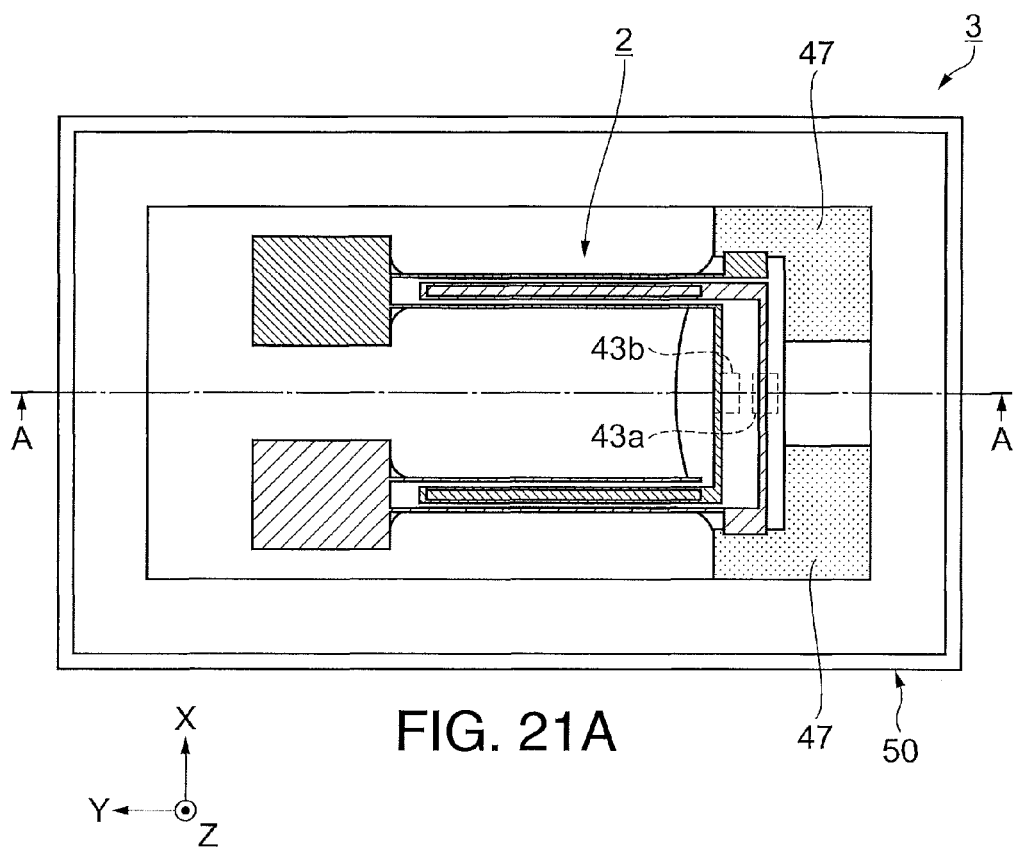
Figure 21B:
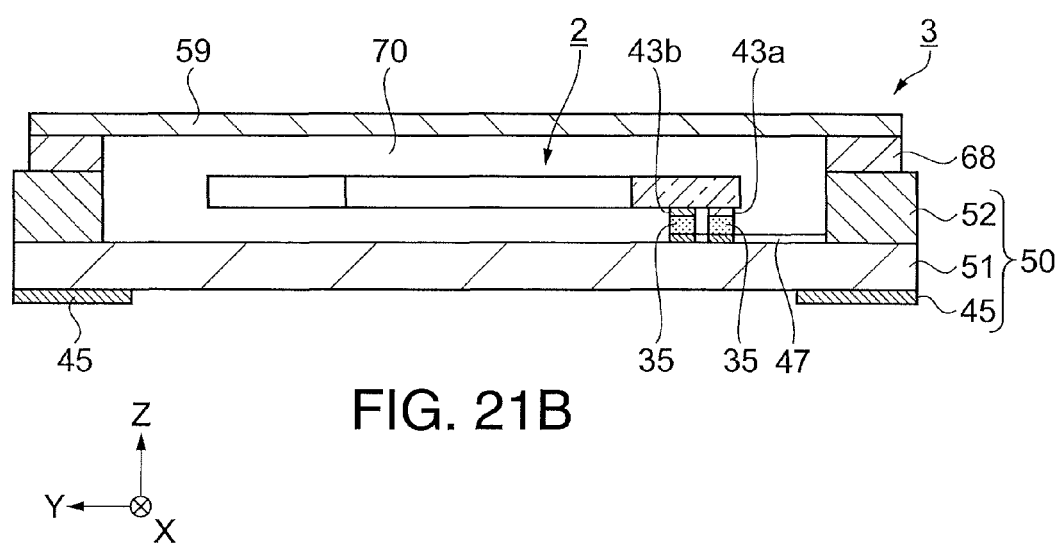

FIGS. 21A and 21B are schematic views showing a structure of the resonator according to the invention, FIG. 21A is a plan view of the resonator, and FIG. 21B is a cross-sectional view taken along A-A line in FIG. 21A. Moreover, in FIG.

21A, for convenience of describing the configuration of the inner portion of the resonator, a state where a cover member is removed is shown.

The resonator 3 is configured of the resonator element 2 on which the electrodes are formed, a package main body 50 which is formed in a rectangular box shape to accommodate the resonator element 2, and a cover member 59 formed of glass, ceramic, metal, or the like. Moreover, the inner portion of a cavity 70 accommodating the resonator element 2 becomes an approximate vacuum decompression space.

As shown in FIG. 21B, the package main body 50 is formed by laminating a first substrate 51, a second substrate 52, and a mounting terminal 45. A plurality of the mounting terminals 45 are formed on a bottom surface of the outer portion of the first substrate 51. In addition, a plurality of connection electrodes 47, which are electrically connected to the mounting terminals 45 via a through electrode or an interlayer wiring (not shown), are provided in a predetermined position of the upper surface of the first substrate 51. The second substrate 52 is formed in an annular body in which the center portion is removed, and the cavity 70 accommodating the resonator element 2 is formed in the second substrate.

The first substrate 51 and the second substrate 52 of the above-described package main body 50 are configured of a material having insulation properties. The material having insulation properties is not particularly limited, and for example, various ceramics such as oxide-based ceramics, nitride-based ceramics, or carbide-based ceramics may be used. Furthermore, generally, each electrode and the terminals which are provided in the package main body 50, the wiring pattern or the inner-layer wiring pattern which electrically connects the electrode and the terminal, and the like are formed by screen-printing and burning metal wiring materials such as tungsten (W) or molybdenum (Mo) on insulating materials, and by coating nickel (Ni), gold (Au), or the like on the metal wiring materials.

Preferably, the cover member 59 is formed of a light transmitting material, for example, borosilicate glass, or the like, is joined by a sealing material 68, and thus, airtightly seals the package main body 50. Accordingly, after the cover of the package main body 50 is sealed, a laser light radiates the vicinity of the tip of the resonator element 2 via the cover member 59 from the outside, and the frequency can be adjusted according to a mass reduction method by partially evaporating the electrode which is provided in the vicinity of the tip. Moreover, when the frequency adjustment is not performed, the cover member 59 may be formed of a metal material such as Kovar alloy.

In the resonator element 2 which is accommodated in the cavity 70 of the package main body 50, the pad electrodes 43a and 43b formed on the base portion 12 and two connection electrodes 47 which are formed on the upper surface of the first substrate 51 of the package main body 50 are positioned, and joined via the joining member 35. For example, the joining member 35 can perform mechanical joining while improving electric connection by using a bump formed of metal or solder, or a conductive joining member such as a conductive adhesive.

Modification Example 1

Next, Modification Example 1 in the case where the resonator element according to the invention is mounted on the package will be described.

Figure 22A:
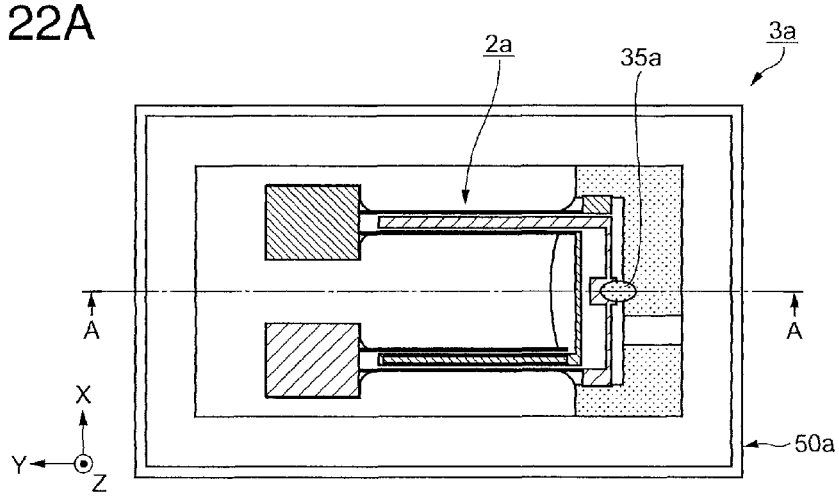
Figure 22B:
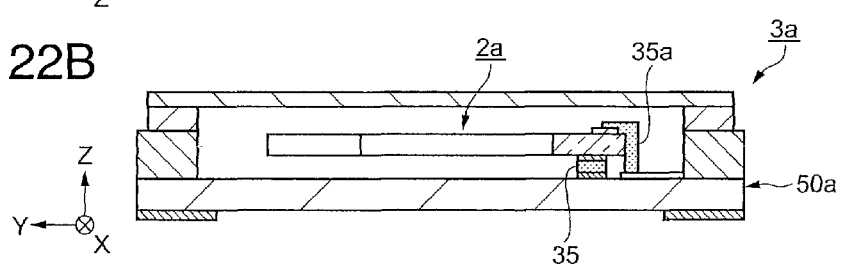

FIGS. 22A and 22B are schematic views showing Modification Example 1 in which the resonator element according to the embodiment according to the invention is mounted on a package, of which, FIG. 22A is a plan view of Modification Example 1, and FIG. 22B is a cross-sectional view taken along A-A line in FIG. 22A.

Hereinafter, in Modification Example 1, differences from the above-described embodiment of FIGS. 21A and 21B are mainly described, and the descriptions with respect to the similar matters are omitted.

In a resonator 3a of Modification Example 1, one of pad electrodes, which are formed on the rear surface (a plane when viewed from the −Z axis direction) of the base portion of the resonator element 2a, is formed on the front surface (a plane when viewed from the +Z axis direction) of the base portion, and is electrically connected to the connection electrode of a package main body 50a via a soft joining member 35a such as a conductive adhesive.

According to the configuration, short circuit between pad electrodes formed on the rear surface (the plane when viewed from the −Z axis direction) of the base portion of the resonator element 2a can be prevented, and malfunction of the resonator can be more efficiently avoided.

Modification Example 2

Next, Modification Example 2 in the case where the resonator element according to the invention is mounted on the package will be described.

Figure 23A:
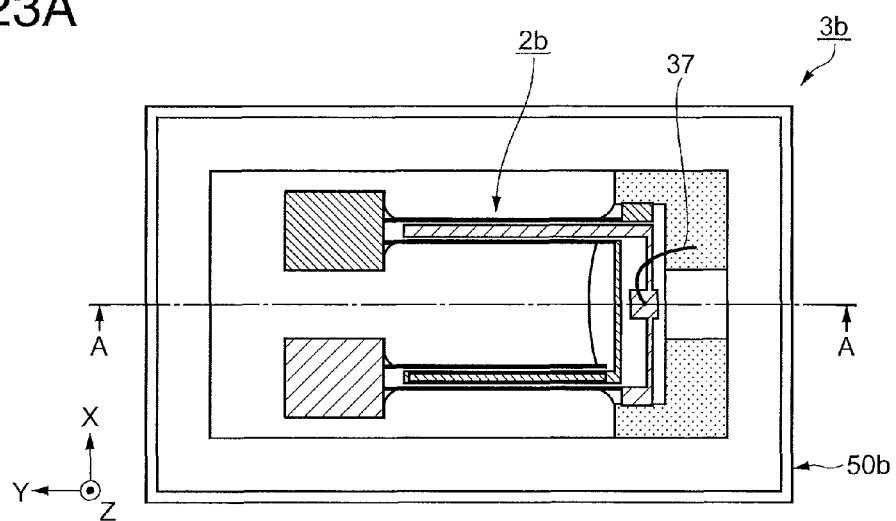
Figure 23B:
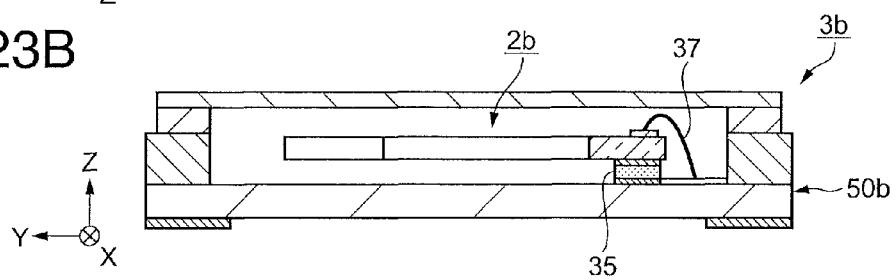

FIGS. 23A and 23B are schematic views showing Modification Example 2 in which the resonator element according to the embodiment according to the invention is mounted on a package, of which, FIG. 23A is a plan view of Modification Example 2, and FIG. 23B is a cross-sectional view taken along A-A line in FIG. 23A.

Hereinafter, in Modification Example 2, differences from the above-described embodiment of FIGS. 21A and 21B are mainly described, and the descriptions with respect to the similar matters are omitted.

In a resonator 3b of Modification Example 2, one of pad electrodes, which are formed on the rear surface (the plane when viewed from the −Z axis direction) of the base portion of the resonator element 2b, is formed on the front surface (the plane when viewed from the +Z axis direction) of the base portion, and is electrically connected to the connection electrode of a package main body 50b via a bonding wire 37.

According to the configuration, short circuit between pad electrodes formed on the rear surface (the plane when viewed from the −Z axis direction) of the base portion of the resonator element 2b can be prevented, and malfunction of the resonator can be more efficiently avoided. Moreover, since the area of the pad electrode formed on the rear surface (the plane when viewed from the −Z axis direction) of the base portion can be increased, mounting strength can be effectively improved.

Modification Example 3

Next, Modification Example 3 in the case where the resonator element according to the invention is mounted on the package will be described.

Figure 24A:
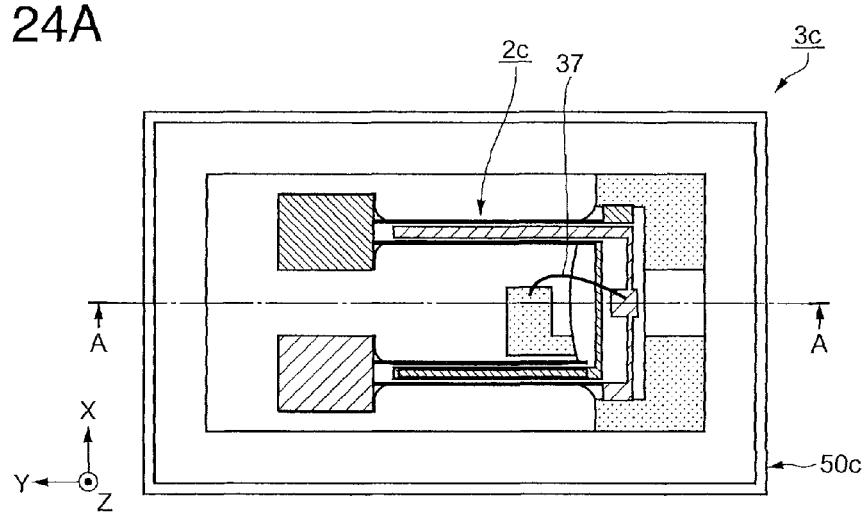
Figure 24B:
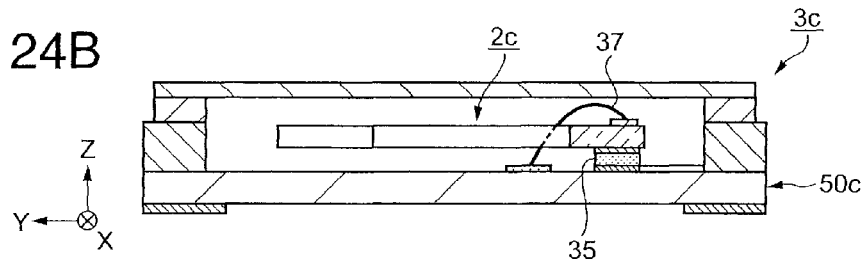

FIGS. 24A and 24B are schematic views showing Modification Example 3 in which the resonator element according to the embodiment according to the invention is mounted on a package, of which, FIG. 24A is a plan view of Modification Example 3, and FIG. 24B is a cross-sectional view taken along A-A line in FIG. 24A.

Hereinafter, in Modification Example 3, differences from the above-described embodiment of FIGS. 21A and 21B are mainly described, and the descriptions with respect to the similar matters are omitted.

In a resonator 3c of Modification Example 3, one of pad electrodes, which are formed on the rear surface (the plane when viewed from the −Z axis direction) of the base portion of the resonator element 2c, is formed on the front surface (the plane when viewed from the +Z axis direction) of the base portion, and is electrically connected to the connection electrode of a package main body 50c, which is formed between the vibrating arms of the resonator element 2c, via the bonding wire 37.

According to the configuration, short circuit between pad electrodes formed on the rear surface (the plane when viewed from the −Z axis direction) of the base portion of the resonator element 2c can be prevented, and malfunction of the resonator can be more efficiently avoided. Moreover, since the area of the pad electrode formed on the rear surface (the plane when viewed from the −Z axis direction) of the base portion can be increased, mounting strength can be effectively improved. Furthermore, since the connection electrode for the bonding wire is formed on the vibrating arm side of the resonator element 2c, the length in the Y axis direction of the package can be shortened, and reduction in the size of the resonator can be effectively improved.

Modification Example 4

Next, Modification Example 4 in the case where the resonator element according to the invention is mounted on the package will be described.

Figure 25A:
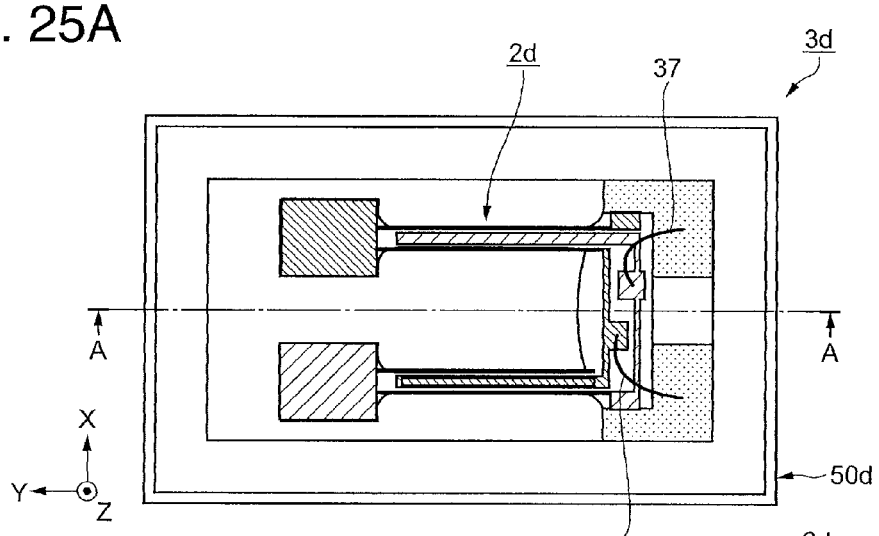
Figure 25B:
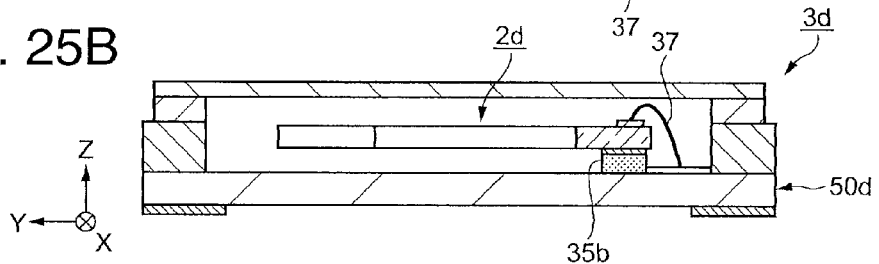

FIGS. 25A and 25B are schematic views showing Modification Example 4 in which the resonator element according to the embodiment according to the invention is mounted on a package, of which, FIG. 25A is a plan view of Modification Example 4, and FIG. 25B is a cross-sectional view taken along A-A line in FIG. 25A.

Hereinafter, in Modification Example 4, differences from the above-described embodiment of FIGS. 21A and 21B are mainly described, and the descriptions with respect to the similar matters are omitted.

In a resonator 3d of Modification Example 4, two pad electrodes are formed on the front surface (the plane when viewed from the +Z axis direction) of the base portion of the resonator element 2d, the rear surface (the plane when viewed from the −Z axis direction) of the base portion is supported to be fixed to a nonconductive joining member 35b, and the pad electrode of the resonator element 2d and the connection electrode of the package main body 50d are electrically connected to each other via the bonding wire 37.

According to the configuration, since the rear surface is supported to be fixed to the nonconductive joining member 35b, short circuit between pad electrodes can be prevented, and since the joining area can be increased, malfunction of the resonator can be more efficiently avoided, and mounting strength can be effectively improved.

Oscillator

Next, an oscillator to which the resonator element according to the invention is applied to will be described.

Figure 26:
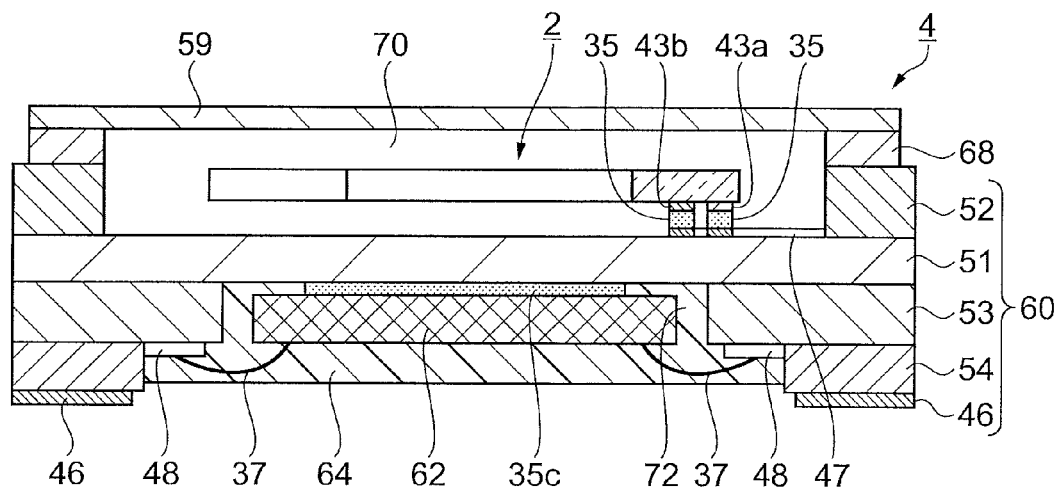
FIG. 26 is a cross-sectional view showing a structure of an oscillator according to the embodiment of the invention.

FIG. 26 is a cross-sectional view showing a structure of the oscillator according to the invention, and an oscillator 4 is configured of the resonator element 2 in which electrodes are formed, a package main body 60 which accommodates the resonator element 2, an IC chip (chip component) 62 for driving the resonator element 2, and the cover member 59 which is formed of glass, ceramic, metal, or the like. Moreover, the inner portion of the cavity 70 accommodating the resonator element 2 becomes an approximate vacuum decompression space.

As shown in FIG. 26, the package main body 60 is formed by laminating the first substrate 51, the second substrate 52, a third substrate 53, a fourth substrate 54, and a mounting terminal 46. Moreover, the package main body 60 includes the cavity 70 which is opened on the upper surface, and a cavity 72 which is opened on the lower surface.

A plurality of the mounting terminals 46 are formed on a bottom surface of the outer portion of the fourth substrate 54. In addition, the mounting terminal 46 is electrically connected to the connection electrode 47 provided on the upper surface of the first substrate 51 or a connection electrode 48 provided on the lower surface of the third substrate 53 via a through electrode or an interlayer wiring (not shown).

Similar to the above-described resonator 3, in the cavity 70 of the package main body 60, the pad electrodes 43a and 43b formed on the resonator element 2 and two connection electrodes 47 which are formed on the upper surface of the first substrate 51 of the package main body 60 are positioned, and are joined via the bump formed of metal, solder, or the like, or the conductive joining member 35 such as a conductive adhesive, and thereafter, the cavity is airtightly sealed by being joined with the sealing material 68 such as borosilicate glass.

Meanwhile, the IC chip 62 is accommodated in the cavity 72 of the package main body 60, and the IC chip 62 is joined to the lower surface of the first substrate 51 via the joining member 35c such as brazing material or an adhesive. Moreover, at least two connection electrodes 48 are formed in the cavity 72. The connection electrode 48 is electrically connected to the IC chip 62 by the bonding wire 37. Moreover, a resin material 64 is filled in the cavity 72, and the IC chip 62 is sealed by the resin material 64.

The IC chip 62 includes a drive circuit (oscillation circuit) for controlling the drive of the resonator element 2, and if the resonator element 2 is driven by the IC chip 62, signals having a predetermined frequency can be extracted.

Electronic Apparatus

Next, an electronic apparatus to which the resonator element according to the invention is applied to will be described in detail with reference to FIGS. 27 to 29.

Figure 27:
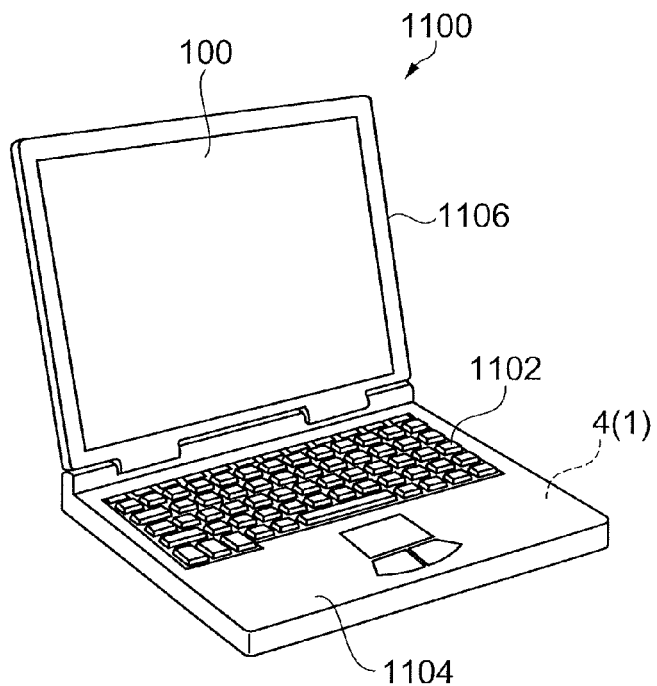
FIG. 27 is a perspective view showing a configuration of a mobile type (or a note type) personal computer which is an electronic apparatus including the resonator element according to the embodiment of the invention.

FIG. 27 is a perspective view showing a configuration of a mobile type (or a note type) personal computer which is an electronic apparatus including the resonator element according to the invention. In FIG. 27, a personal computer 1100 is configured of a main body portion 1104 having a keyboard 1102 and a display unit 1106 having a display portion 100, and the display unit 1106 is rotatably supported to the main body portion 1104 via a hinge structure portion. The oscillator 4 (resonator element 1) is built in the personal computer 1100.

Figure 28:
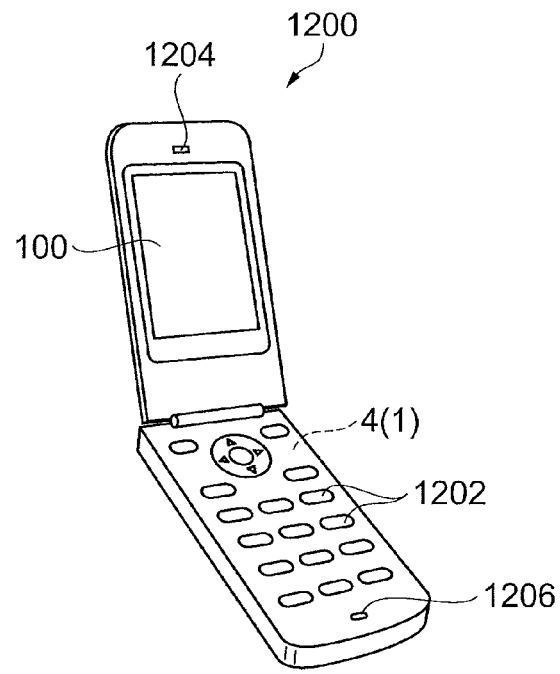
FIG. 28 is a perspective view showing a configuration of a cellular phone (also includes PHS) which is an electronic apparatus including the resonator element according to the embodiment of the invention.

FIG. 28 is a perspective view showing a configuration of a cellular phone (also includes PHS) which is an electronic apparatus including the resonator element according to the invention. In FIG. 28, a cellular phone 1200 includes a plurality of operation buttons 1202, an ear piece 1204, and a mouth piece 1206, and a display portion 100 is disposed between the operation buttons 1202 and the ear piece 1204. The oscillator 4 (resonator element 1) is built in the cellular phone 1200.

Figure 29:
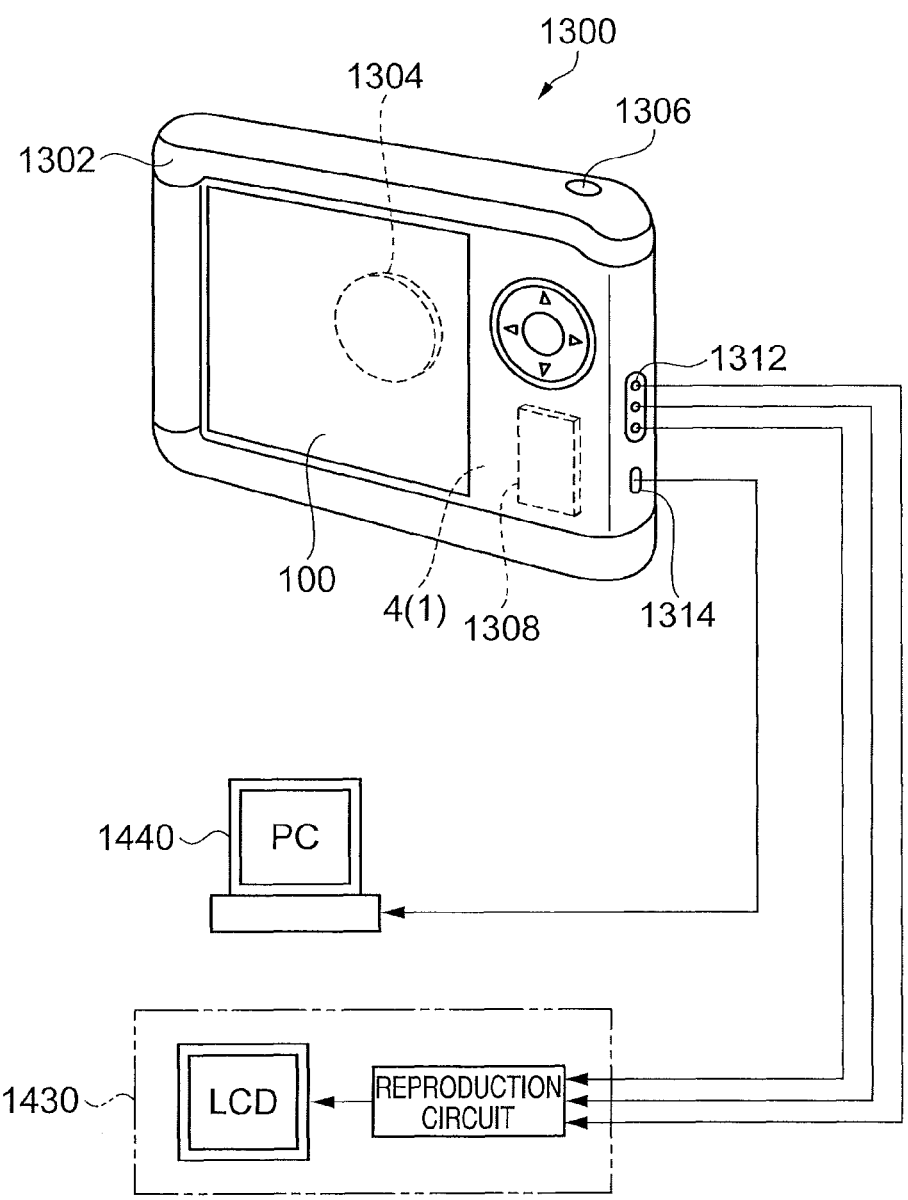
FIG. 29 is a perspective view showing a configuration of a digital camera which is an electronic apparatus including the resonator element according to the embodiment of the invention.

FIG. 29 is a perspective view showing a configuration of a digital camera which is an electronic apparatus including the resonator element according to the invention. Moreover, in FIG. 29, the connection to the external apparatus is shown simply. Here, in a general camera, a silver salt photographic film is exposed by a light image of a subject. On the other hand, in a digital camera 1300, the light image of the subject is photoelectrically converted by an imaging device such as a Charge Coupled Device (CCD), and imaging signals (image signals) are generated.

A display portion 100 is provided on the rear surface of a case (body) 1302 in a digital camera 1300 and is configured to perform the display based on imaging signals of the CCD, and the display portion 100 functions as a finder which displays the subject as an electronic image. Moreover, a light receiving unit 1304 including an optical lens (an imaging optical system), the CCD, or the like is provided on the front surface side (the rear surface side in the drawing) of the case 1302.

If a photographer confirms a subject image displayed on the display portion 100 and presses a shutter button 1306, the imaging signals of the CCD at the point in time are transmitted to and stored in a memory 1308. Moreover, in the digital camera 1300, a video signal output terminal 1312, an input and output terminal for data communication 1314 are provided on the side surface of the case 1302. Moreover, as shown in FIG. 29, a television monitor 1430 is connected to the video signal output terminal 1312 and a personal computer (PC) 1440 is connected to the input and output terminal for data communication 1314, if necessary. Moreover, the imaging signals stored in the memory 1308 are output to the television monitor 1430 or the personal computer 1440 according to a predetermined operation. The oscillator 4 (resonator element 1) is built in the digital camera 1300.

In addition, for example, the electronic apparatus including the resonator element according to the invention may be applied to an ink jet type ejecting apparatus (for example, an ink jet printer), a personal computer, a television, a video camera, a video tape recorder, a car navigation apparatus, a pager, an electronic organizer (with a communication function), an electronic dictionary, an electronic calculator, an electronic game apparatus, a word processor, a work station, a video telephone, a television monitor for crime prevention, an electronic binocular, a POS terminal, a medical apparatus (for example, electronic thermometer, sphygmomanometer, blood sugar meter, electrocardiogram measurement device, ultrasonic diagnostic apparatus, electronic endoscope), a fish finder, various measurement devices, instruments (for example, instruments for vehicle, airplane, and ship), a flight simulator, or the like, in addition to the personal computer (mobile type personal computer) of FIG. 27, the cellular phone of FIG. 28, and the digital camera of FIG. 29.

Moving Object

Figure 30:
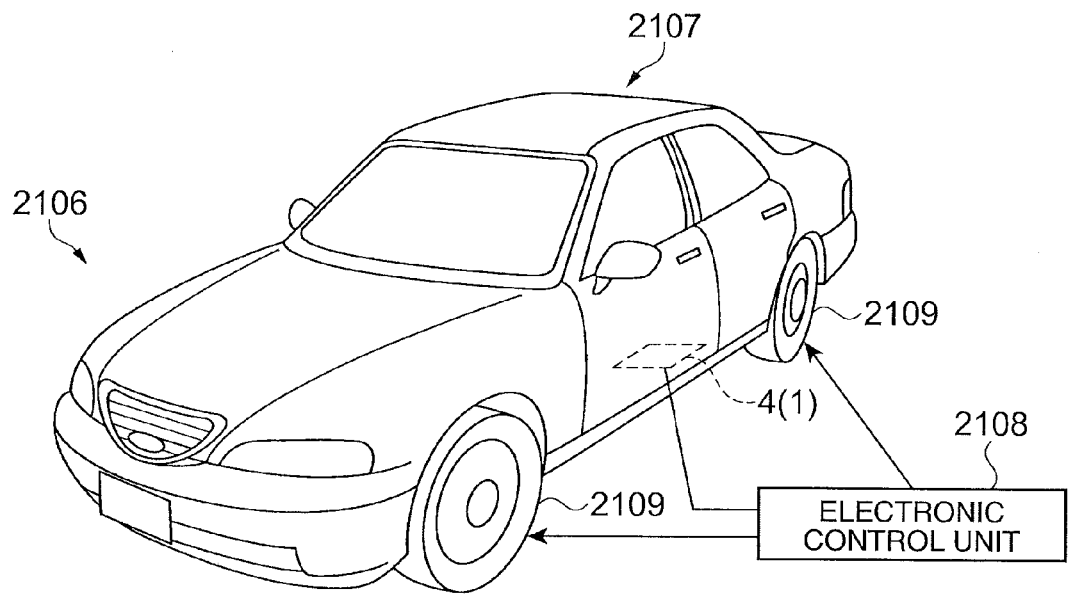
FIG. 30 is a perspective view showing a configuration of an automobile which is a moving object to which the resonator or the oscillator including the resonator element according to the embodiment of the invention is applied.
Figure 31:
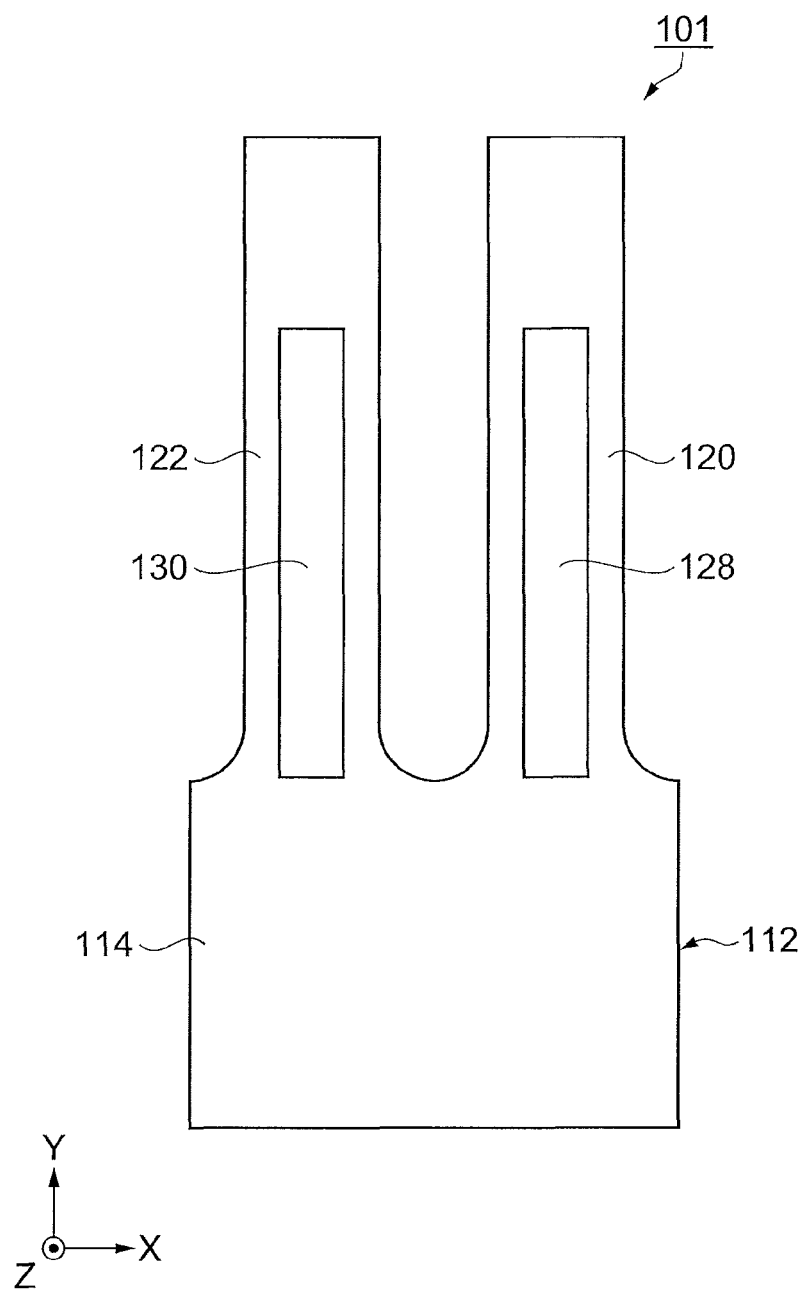
FIG. 31 is a plan view showing a structure of a general resonator element.

FIG. 30 is a perspective view schematically showing an automobile 2106 which is a moving object to which the resonator or the oscillator including the resonator element according to the invention is applied. In FIG. 30, the oscillator 4 (resonator element 1) is built in an electronic control unit 2108 which controls a tire 2109 and is mounted on a vehicle body 2107.

The resonator or the oscillator including the resonator element according to the invention is mounted on the automobile 2106, and for example, may be widely applied to a keyless entry, an immobilizer, a car navigation system, a car air-conditioner, Antilock Brake System (ABS), an air back, Tire Press Monitoring System (TPMS), an engine control, a battery monitor of hybrid automobile or electric automobile, Electronic Control Unit (ECU) 2108 of a vehicle body attitude control system or the like.

As described above, the resonator element, the resonator, the oscillator, the electronic apparatus, and the moving object according to the invention are described based on the shown embodiments. However, the invention is not limited to this, and the configuration of each portion may be replaced by an arbitrary configuration having a similar function. Moreover, in the invention, other arbitrary components may be added. In addition, respective embodiments may be appropriately combined.

Furthermore, a protrusion or a depressed portion (notch) may be formed on the contours of the reduced width portions of the above-described embodiments.

Moreover, as described above, the embodiments are described in detail. However, a person skilled in the art easily understands that various modifications which do not substantially depart from new matters or effects of the invention are possible. Accordingly, all Modification Examples are included in the scope of the invention. For example, in the embodiments and Modification Examples described above, the example which uses quartz crystal as the formation material for the resonator element is described. However, piezoelectric materials other than quartz crystal may be used. For example, a lamination piezoelectric substrate, a piezoelectric ceramics, or the like may be used, which is configured by laminating piezoelectric materials such as aluminum nitride or tantalum pentoxide ($Ta_2O_5$) on an oxide substrate of aluminum nitride (AlN), lithium niobate ($LiNbO_3$), lithium tantalate ($LiTaO_3$), lead zirconate titanate (PZT), lithium tetraborate ($Li_2B_4O_7$), langsite ($La_3Ga_5SiO_{14}$), or the like, or a glass substrate.

Moreover, the resonator element may be formed using materials other than the piezoelectric material. For example, the resonator element may be formed using a silicon semiconductor material or the like. In addition, the vibration (drive) method of the resonator element is not limited to the piezoelectric drive. Also in a resonator element such as an electrostatic drive type using an electrostatic force or a Lorentz drive type using a magnetic force other than the piezoelectric drive type using the piezoelectric substrate, the configuration and the effects of the invention can be exhibited. In addition, in the specification or the drawings, terms, which are described along with terms having broad senses or synonymous with different terms at least once, can be replaced by the different terms at any location of the specification or the drawings.

Moreover, the configurations and the operations of the resonator element 1, the resonator 3, the oscillator 4, the personal computer 1100, the cellular phone (including PHS) 1200, the camera 1300, the automobile 2106, or the like are not limited to those which are described according to the embodiments, and various modifications are possible. Furthermore, it is needless to say that the resonator element 1 according to the invention can be applied not only to a gyro sensor but also to various sensors such as a pressure sensor, an acceleration sensor, and an inclination sensor.

The entire disclosure of Japanese Patent Application No. 2012-235417, filed Oct. 25, 2012 is expressly incorporated by reference herein.

What is claimed is:
1. A resonator element comprising:
a base portion which includes one end portion and the other end portion opposing the one end portion in a plan view; and
only one pair of vibrating arms which extend along a first direction from the one end portion of the base portion, wherein
the base portion includes a reduced width portion in which a width of the base portion in a second direction intersecting the first direction is gradually decreased along the first direction, in at least one of the one end portion and the other end portion, a fixing portion for fixing the resonator element is provided between the one end portion and the other end portion of the base portion, and a length L, in the first direction, from an outer edge of the other end portion of the base portion to a connection portion of the vibrating arm, is less than a distance Ws, in the second direction, from a center of one of the vibrating arms to a center of the other of the vibrating arms, the connection portion connecting the vibrating arms to the base portion.

2. The resonator element according to claim 1, wherein an outer edge of the reduced width portion passes through a center between the pair of vibrating arms in a plan view, and has a symmetrical shape with respect to a virtual center line along the first direction.

3. The resonator element according to claim 1, wherein the outer edge of the reduced width portion has a curved shape.

4. The resonator element according to claim 1, wherein the outer edge of the reduced width portion includes a pair of inclined portions which are inclined in mutually reversed directions with respect to the second direction.

5. The resonator element according to claim 4, wherein the reduced width portion includes a corner in a connection portion of the pair of inclined portions.

6. The resonator element according to claim 1, wherein the reduced width portion is provided in the one end portion side.

7. The resonator element according to claim 1, wherein the reduced width portion is provided in the other end portion side.

8. The resonator element according to claim 1, wherein the reduced width portion is provided in both of the one end portion side and the other end portion side.

9. The resonator element according to claim 1, wherein the fixing portion passes through the center between the pair of vibrating arms in a plan view, and is positioned in two locations different from each other on the virtual center line along the first direction, and when a length in the second direction of the base portion is defined as W and a length from the virtual center line to a center of the fixing portion is defined as X1, X1/(W/2)×100 is 0% or more and 45% or less.

10. The resonator element according to claim 1, wherein the fixing portion is positioned in two locations different from each other along the second direction, and when a length in the second direction of the base portion is defined as W, and a length which passes through the center between the pair of vibrating arms and is from the virtual center line along the first direction to the center of the fixing portion is defined as X1, X1/(W/2)×100 is 18% or more and 45% or less.

11. A resonator comprising:
the resonator element according to claim 1; and
a container to which the fixing portion of the resonator element is fixed.

12. A resonator comprising:
the resonator element according to claim 2; and
a container to which the fixing portion of the resonator element is fixed.

13. The resonator according to claim 11, wherein one location of the fixing portion is fixed.

14. The resonator according to claim 11, wherein an electrode pad provided in first principle surface of the base portion, the first principal surface being opposite to a second principle surface of the fixing portion side of the base portion, and an electrode terminal provided in the container are connected to each other by a wire.

15. An oscillator comprising:
the resonator element according to claim 1; and
a circuit.

16. An oscillator comprising:
the resonator element according to claim 2; and
a circuit.

17. An electronic apparatus comprising:
the resonator element according to claim 1.

18. An electronic apparatus comprising:
the resonator element according to claim 2.

19. A moving object comprising:
the resonator element according to claim 1.

20. A moving object comprising:
the resonator element according to claim 2.

* * * * *